(12) United States Patent
Kurata

(10) Patent No.: US 11,894,325 B2
(45) Date of Patent: Feb. 6, 2024

(54) SEMICONDUCTOR DEVICE HAVING A RESIN THAT SEALS A REWIRING

(71) Applicant: ROHM CO., LTD., Kyoto (JP)

(72) Inventor: Manato Kurata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 135 days.

(21) Appl. No.: 17/294,066

(22) PCT Filed: Nov. 13, 2019

(86) PCT No.: PCT/JP2019/044563
§ 371 (c)(1),
(2) Date: May 14, 2021

(87) PCT Pub. No.: WO2020/100947
PCT Pub. Date: May 22, 2020

(65) Prior Publication Data
US 2021/0407937 A1 Dec. 30, 2021

(30) Foreign Application Priority Data

Nov. 15, 2018 (JP) ................................. 2018-214867

(51) Int. Cl.
*H01L 23/00* (2006.01)

(52) U.S. Cl.
CPC .............. *H01L 24/05* (2013.01); *H01L 24/13* (2013.01); *H01L 24/29* (2013.01); *H01L 24/73* (2013.01);
(Continued)

(58) Field of Classification Search
CPC ......... H01L 24/05; H01L 24/13; H01L 24/29; H01L 24/73; H01L 2224/02331;
(Continued)

(56) References Cited

U.S. PATENT DOCUMENTS

| 6,107,679 A | 8/2000 | Noguchi |
| 2004/0229445 A1 | 11/2004 | Suzuki et al. |

(Continued)

FOREIGN PATENT DOCUMENTS

| CN | 101399256 A | * | 4/2009 | ........... H01L 23/585 |
| CN | 101843181 A | * | 9/2010 | ....... H01L 23/49861 |

(Continued)

OTHER PUBLICATIONS

Chinese Office Action dated May 31, 2023, in the counterpart Chinese Patent Application No. 201980075295.X.

(Continued)

*Primary Examiner* — Douglas W Owens
(74) *Attorney, Agent, or Firm* — Rabin & Berdo, P.C.

(57) ABSTRACT

A semiconductor device includes a semiconductor layer that has a main surface, an electrode pad that is formed on the main surface, a rewiring that has a first wiring surface connected to the electrode pad and a second wiring surface positioned on a side opposite to the first wiring surface and being roughened, the rewiring being formed on the main surface such as to be drawn out to a region outside the electrode pad, and a resin that covers the second wiring surface on the main surface and that seals the rewiring.

27 Claims, 31 Drawing Sheets

(52) U.S. Cl.
CPC ............... *H01L 2224/02331* (2013.01); *H01L 2224/0401* (2013.01); *H01L 2224/05548* (2013.01); *H01L 2224/05557* (2013.01); *H01L 2224/05647* (2013.01); *H01L 2224/13017* (2013.01); *H01L 2224/1357* (2013.01); *H01L 2224/13147* (2013.01); *H01L 2224/2929* (2013.01); *H01L 2224/29388* (2013.01); *H01L 2224/73104* (2013.01)

(58) Field of Classification Search
CPC ... H01L 2224/0401; H01L 2224/05548; H01L 2224/05557; H01L 2224/05647; H01L 2224/13017; H01L 2224/13147; H01L 2224/1357; H01L 2224/2929; H01L 2224/29388; H01L 2224/73104; H01L 23/525; H01L 24/03; H01L 24/11; H01L 24/02; H01L 2224/02311; H01L 2224/0239; H01L 2224/0345
See application file for complete search history.

(56) References Cited

U.S. PATENT DOCUMENTS

| | | | |
|---|---|---|---|
| 2005/0112861 A1* | 5/2005 | Fitzsimmons | H01L 24/48 257/E23.02 |
| 2005/0230827 A1 | 10/2005 | Naito et al. | |
| 2016/0365327 A1* | 12/2016 | Shimodaira | H01L 24/73 |
| 2017/0040249 A1* | 2/2017 | Yanagisawa | H05K 1/111 |
| 2018/0019196 A1* | 1/2018 | Sakai | H01L 24/97 |
| 2018/0061765 A1* | 3/2018 | Gozu | H01L 21/4857 |

FOREIGN PATENT DOCUMENTS

| | | | | |
|---|---|---|---|---|
| JP | H11186468 A | | 7/1999 | |
| JP | 2003124391 A | * | 4/2003 | |
| JP | 2003124391 A | | 4/2003 | |
| JP | 2004282035 A | | 10/2004 | |
| JP | 2005277034 A | | 10/2005 | |
| JP | 2006210406 A | | 8/2006 | |
| JP | 2007134552 A | | 5/2007 | |
| JP | 2013115336 A | | 6/2013 | |
| WO | WO-2008071576 A2 | * | 6/2008 | ............. H01L 24/05 |

OTHER PUBLICATIONS

Korean Request for the Submission of an Opinion in the counterpart Korean patent application No. 10-2021-7013520, dated Dec. 8, 2023.

* cited by examiner

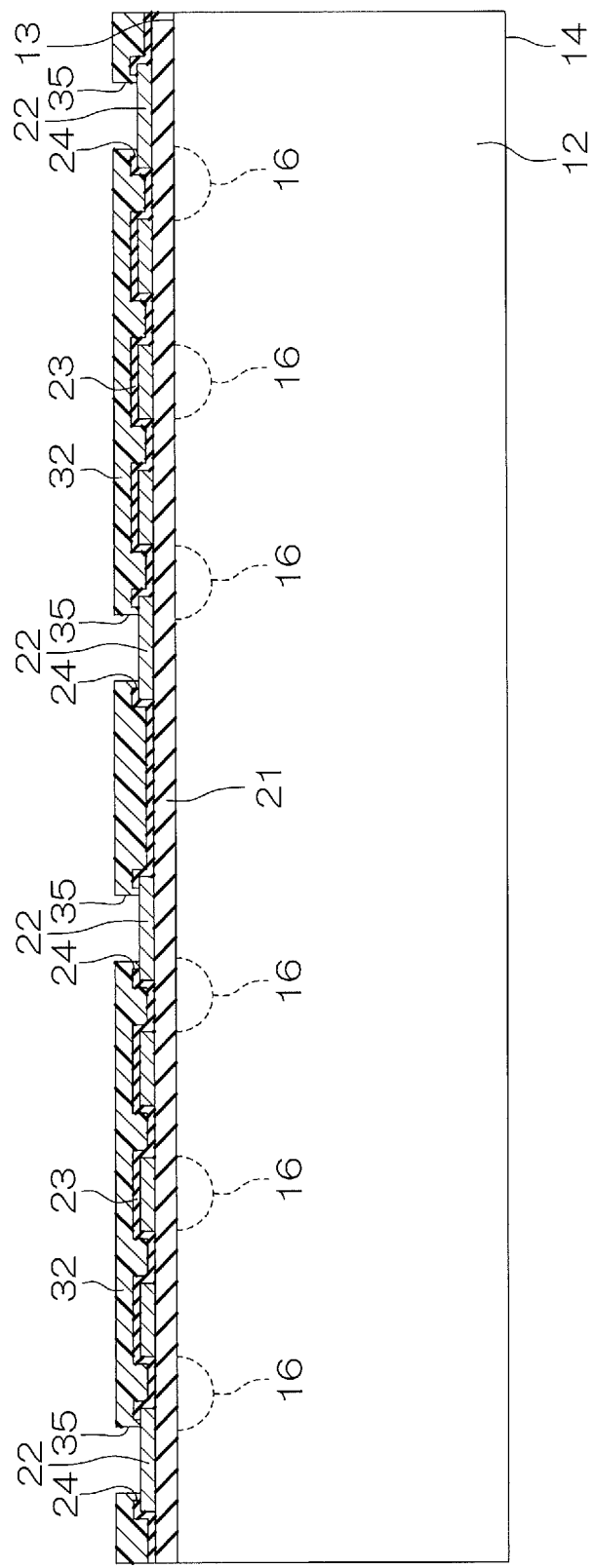

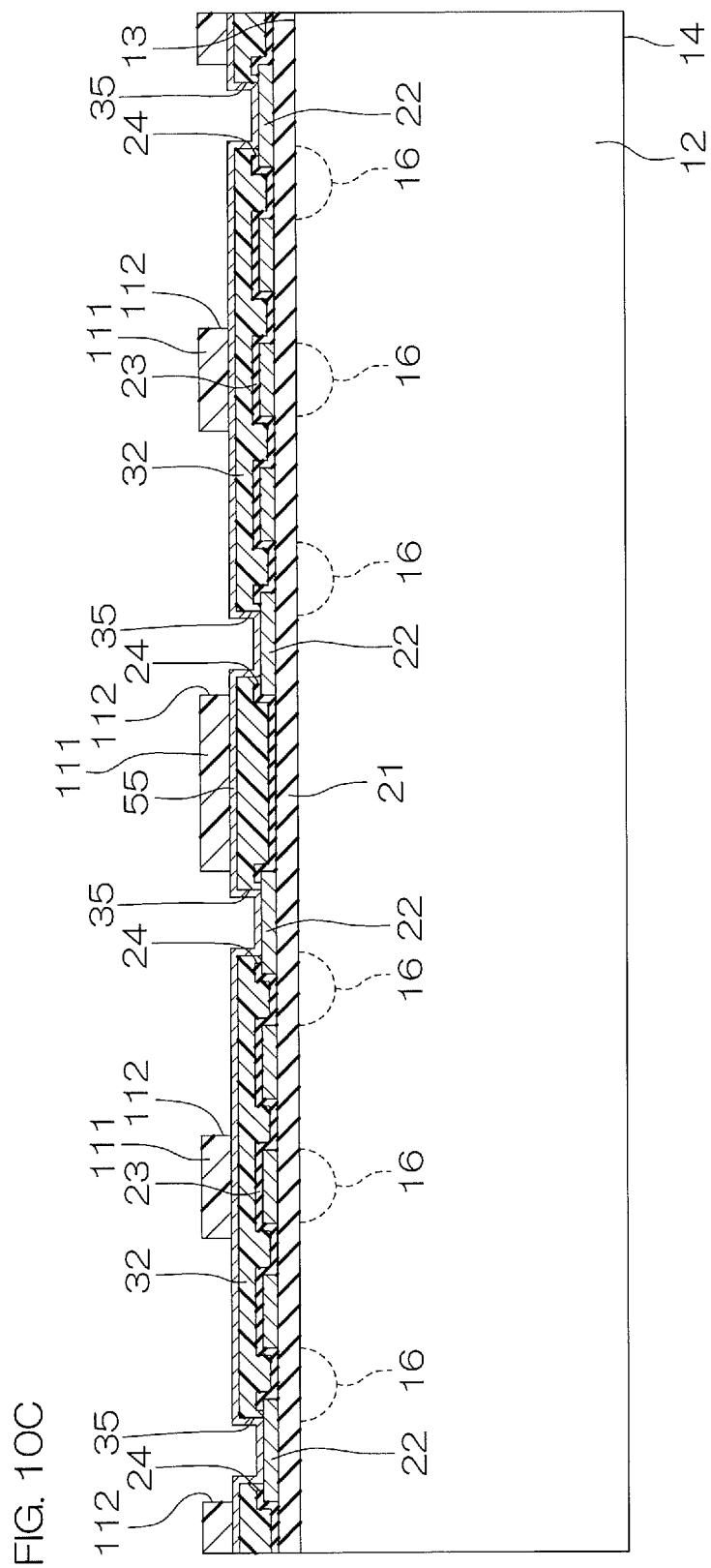

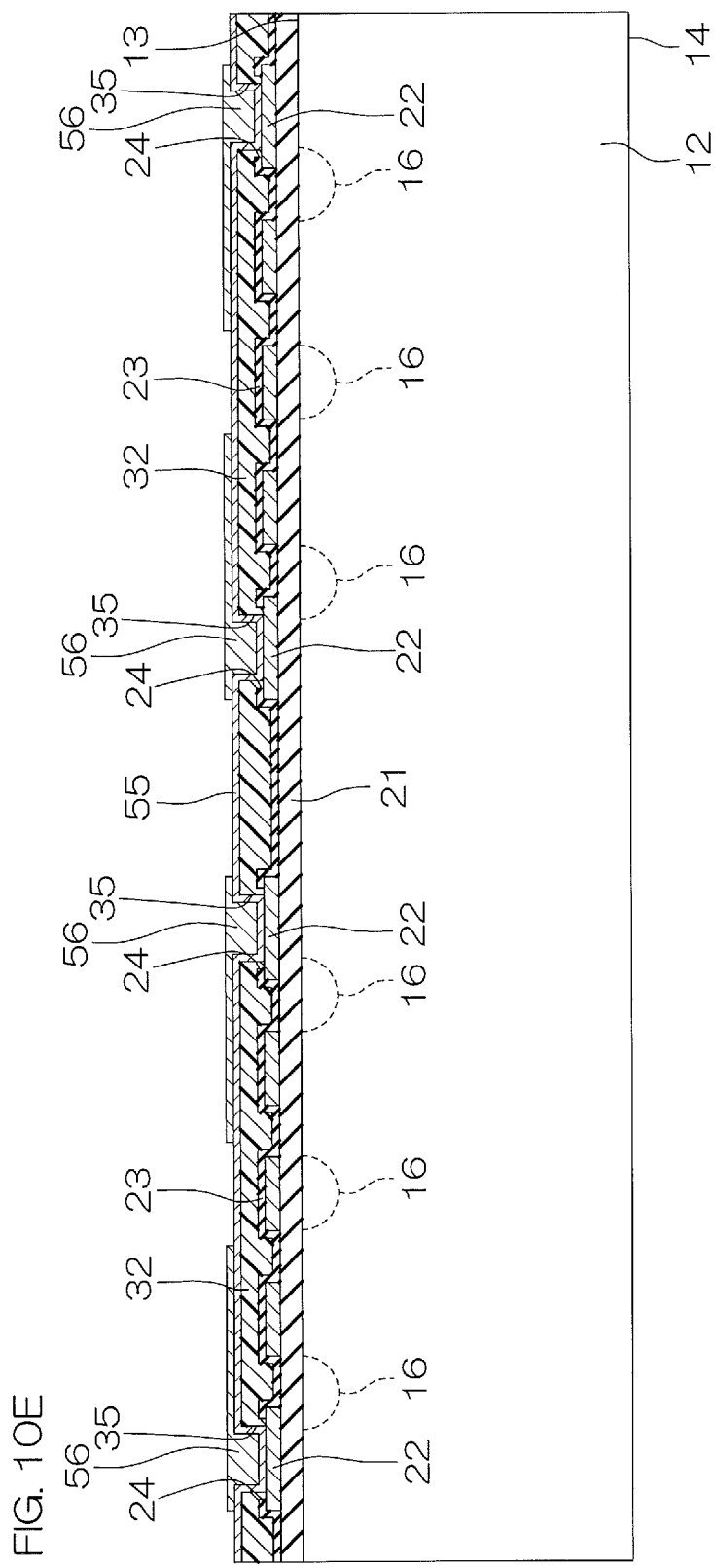

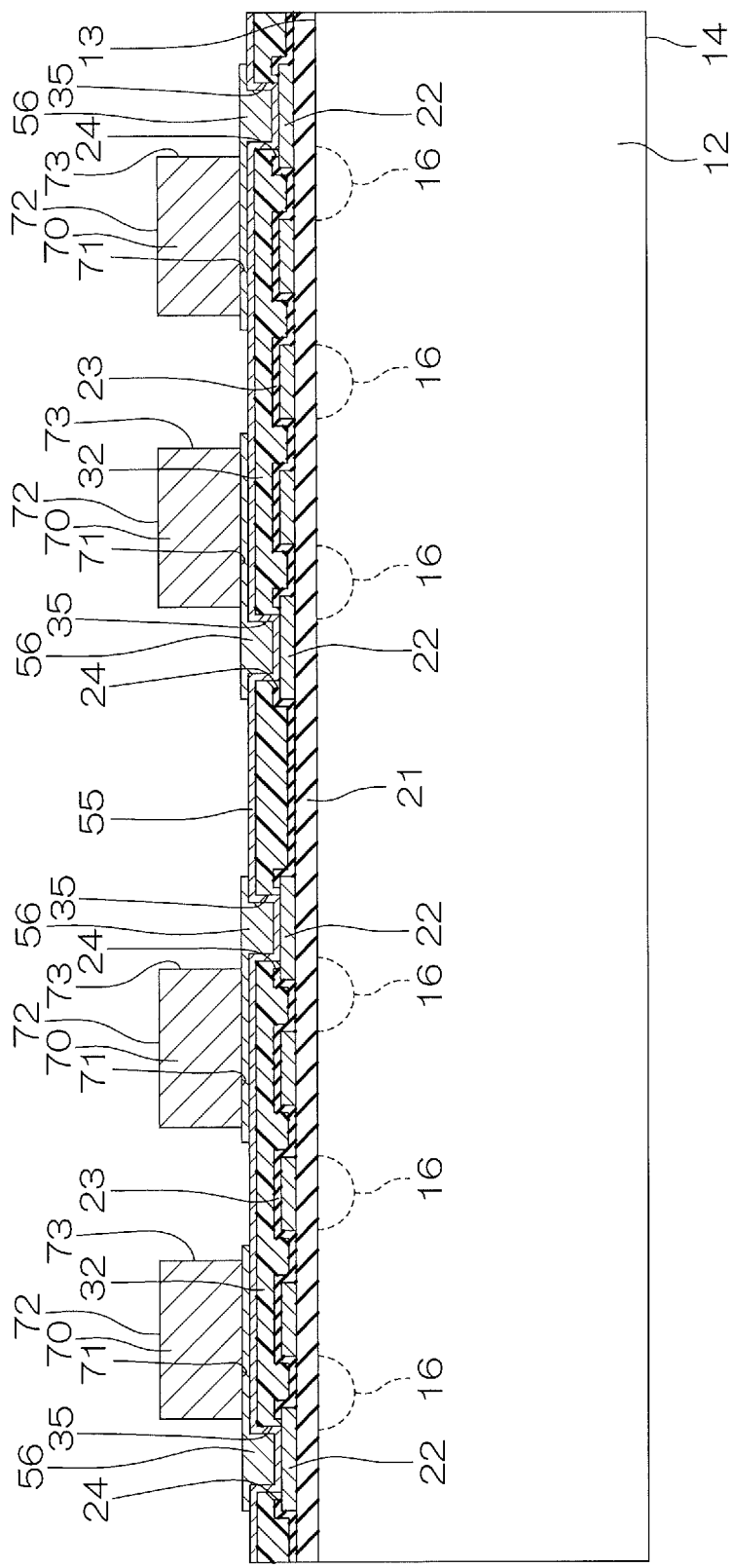

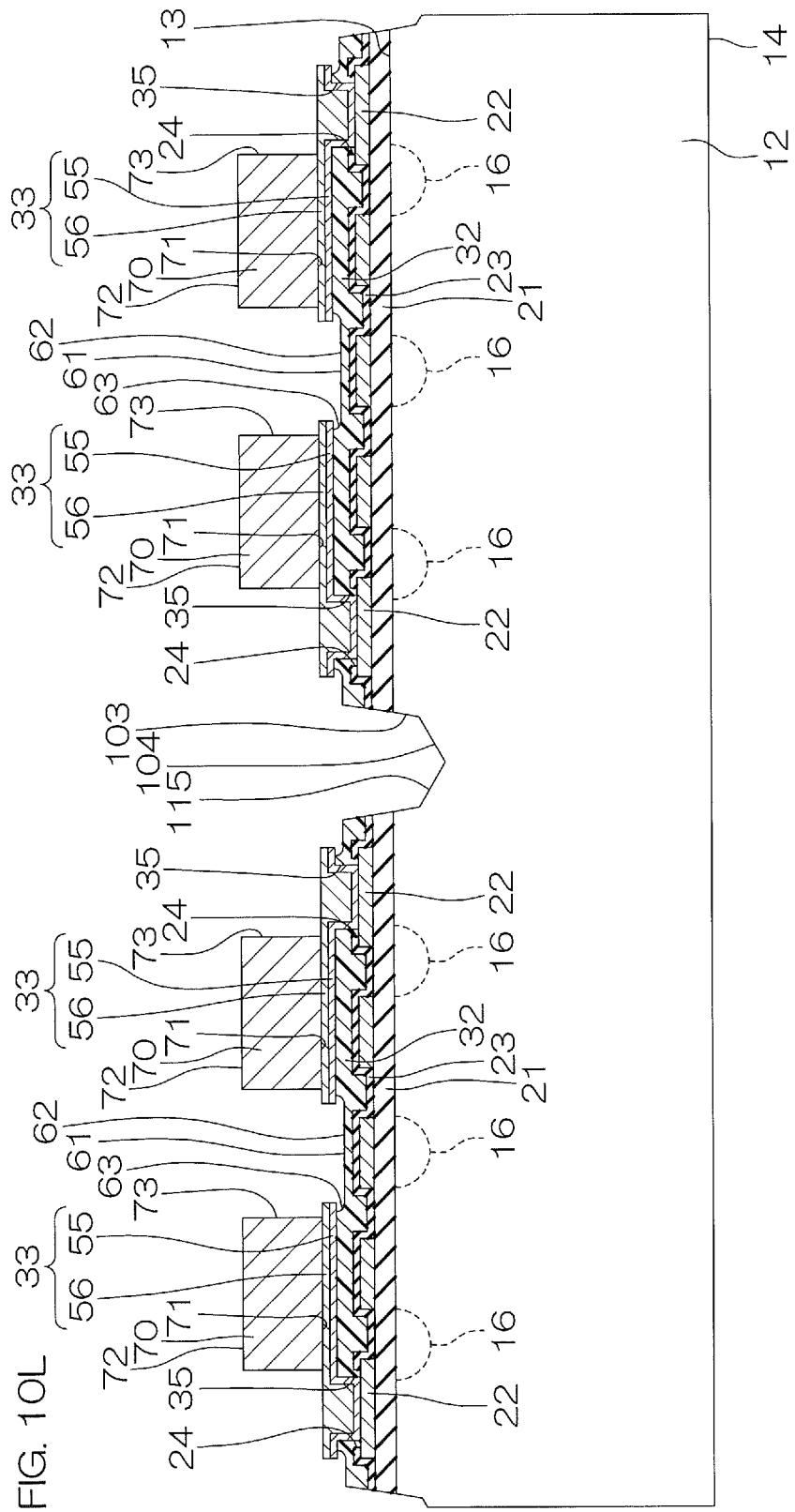

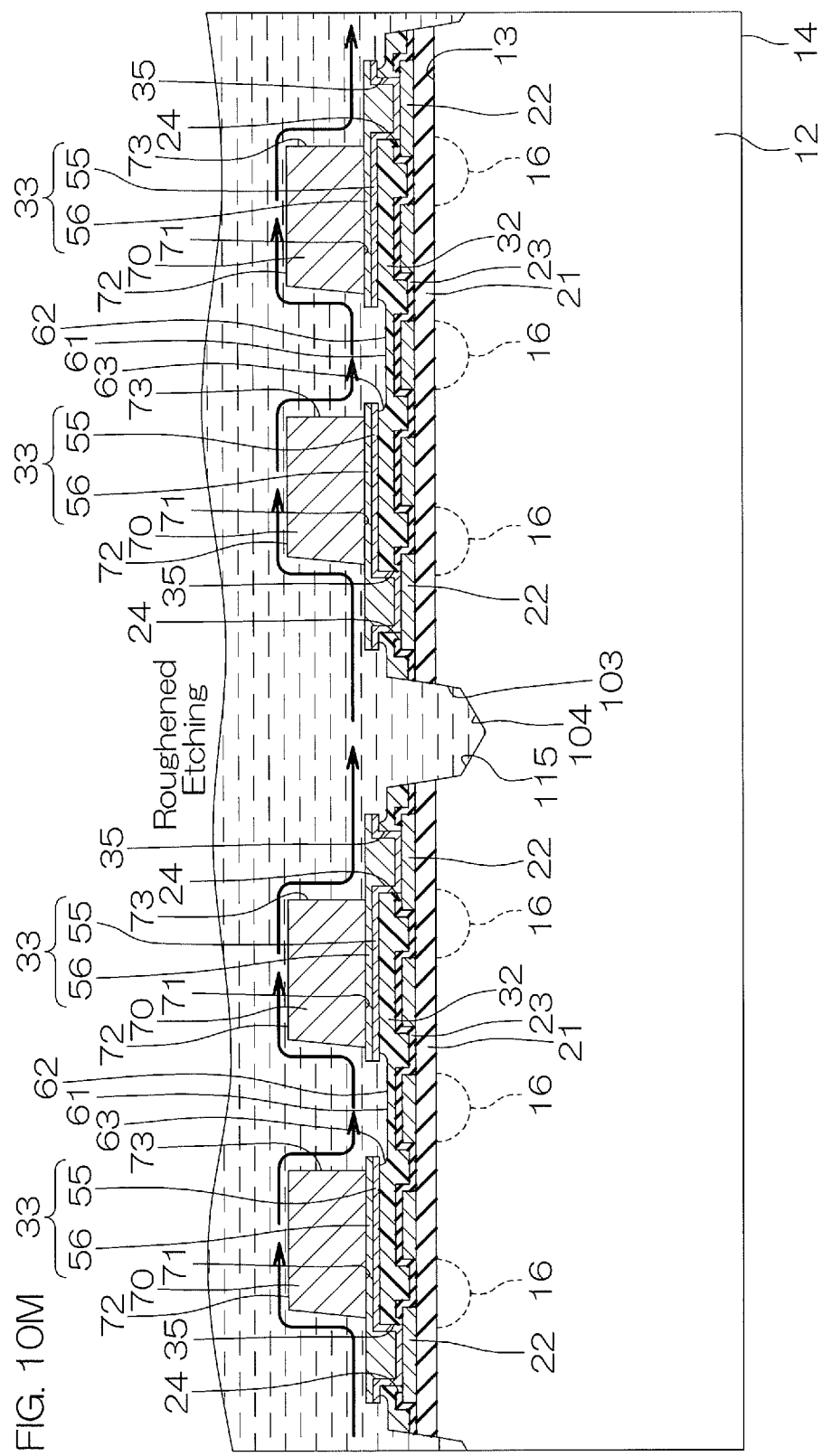

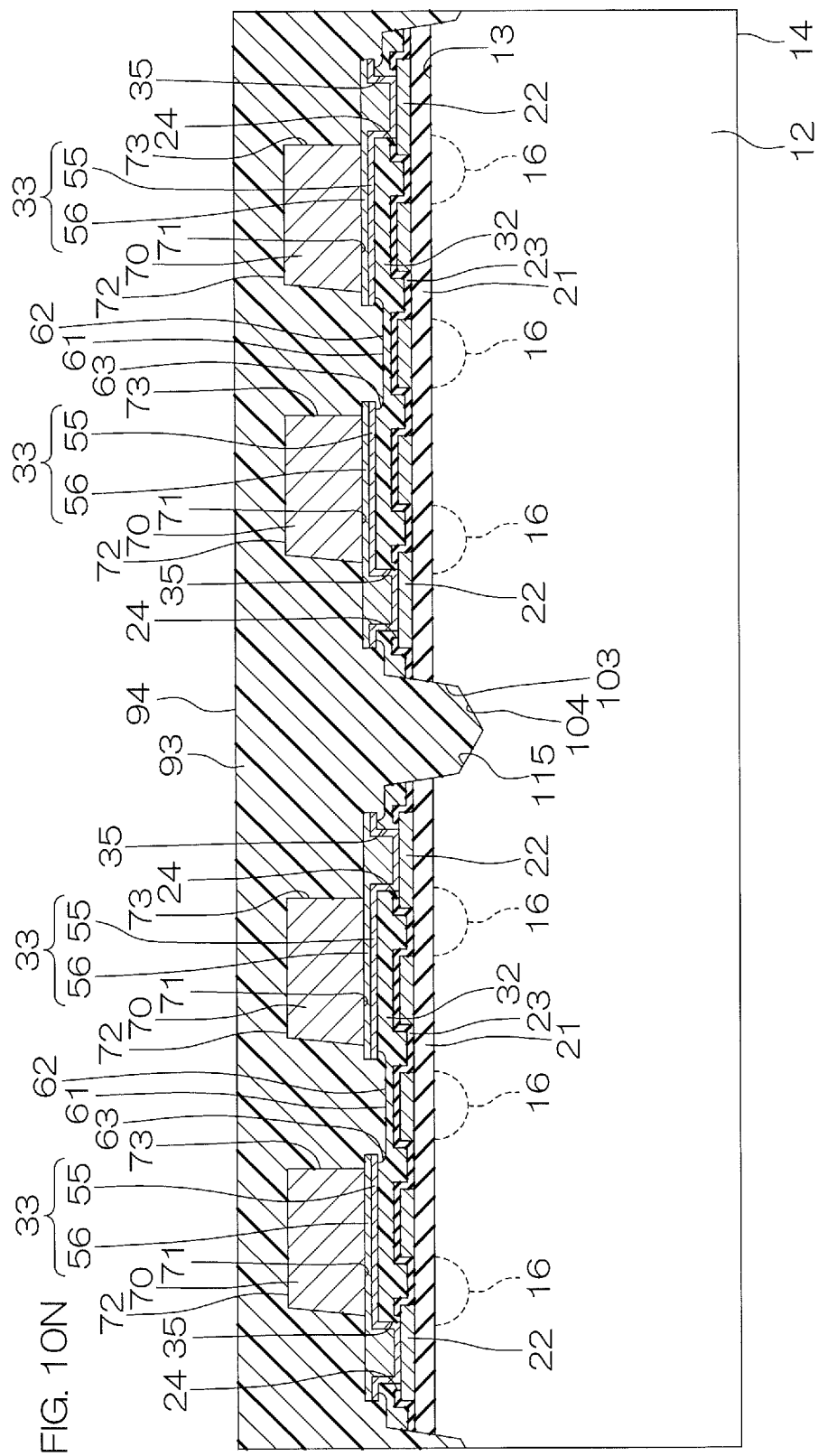

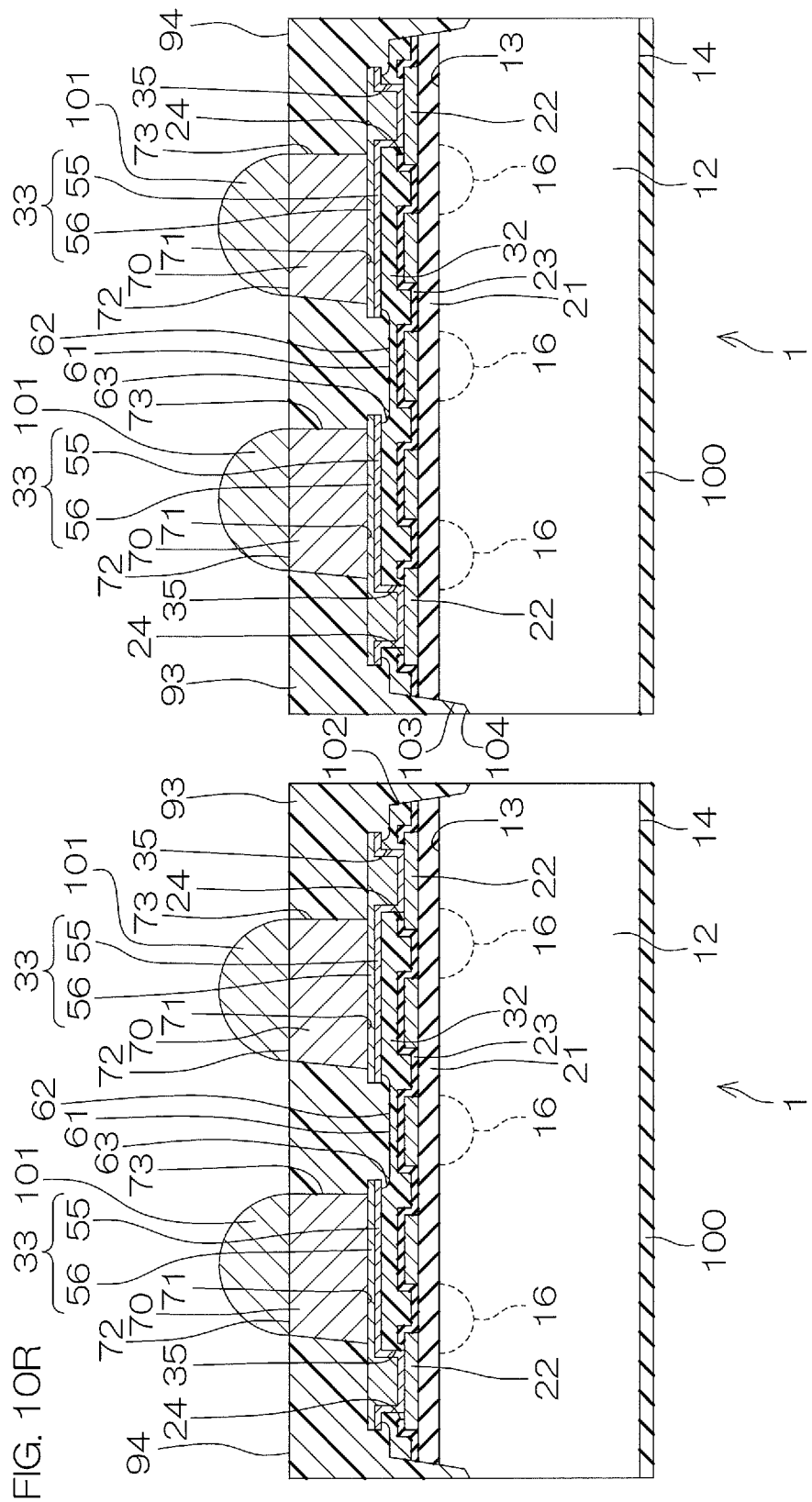

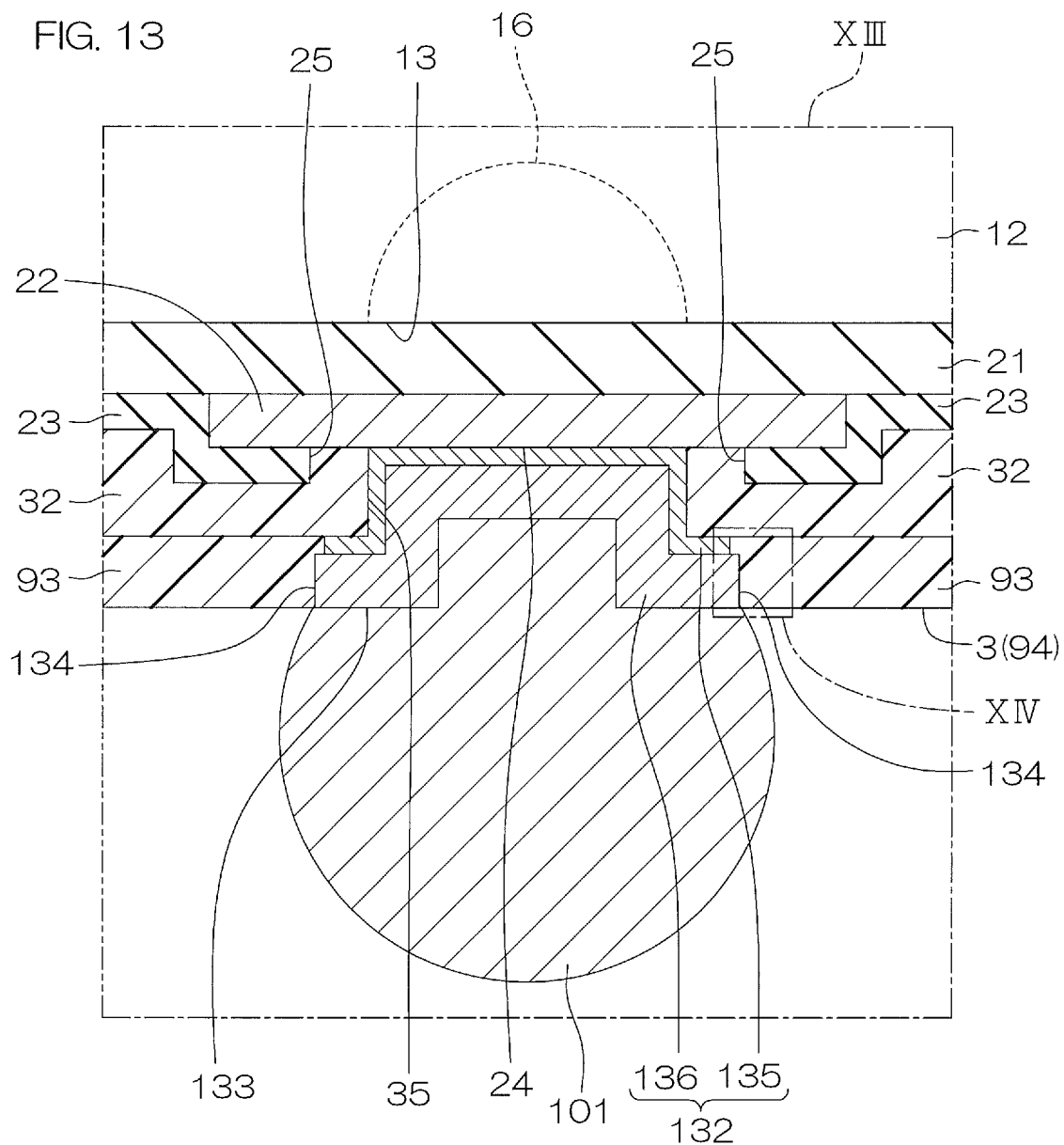

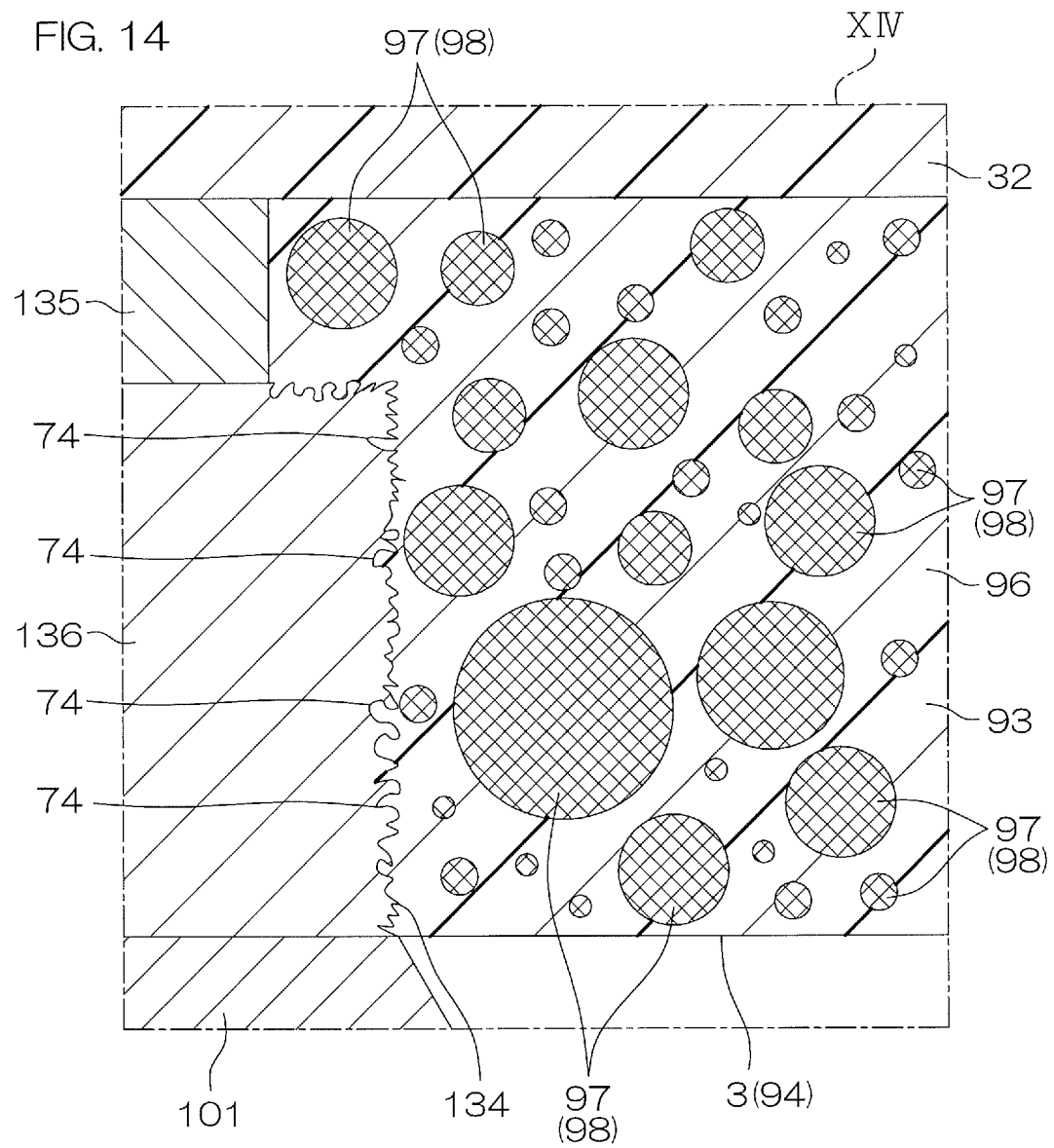

SEMICONDUCTOR DEVICE HAVING A RESIN THAT SEALS A REWIRING

TECHNICAL FIELD

The present invention relates to a semiconductor device having a rewiring.

BACKGROUND ART

Patent Literature 1 discloses a WL-CSP (Wafer Level-Chip Size Package) type semiconductor device. This semiconductor device includes a silicon substrate, a terminal pad (electrode) formed on the silicon substrate, a rewiring connected to the terminal pad, a copper post connected to the rewiring, and a molding resin (a resin) with which the rewiring and the copper post (post electrode) are sealed on the silicon substrate.

CITATION LIST

Patent Literature

Patent Literature 1: Japanese Patent Application Publication No. 2007-134552

SUMMARY OF INVENTION

Technical Problem

A preferred embodiment of the present invention provides a semiconductor device that is capable of preventing a resin from being peeled off.

Solution to Problem

One preferred embodiment of the present invention provides a semiconductor device that includes a semiconductor layer that has a main surface, an electrode pad that is formed on the main surface, a rewiring that has a first wiring surface connected to the electrode pad and a second wiring surface positioned on a side opposite to the first wiring surface and being roughened, the rewiring being formed on the main surface such as to be drawn out to a region outside the electrode pad, and a resin that covers the second wiring surface on the main surface and that seals the rewiring.

According to this semiconductor device, it is possible to raise the adhesive force of the resin with respect to the rewiring by the roughened second wiring surface. Therefore, it is possible to provide the semiconductor device capable of preventing the peel-off of the resin.

One preferred embodiment of the present invention provides a semiconductor device that includes a semiconductor layer that has a main surface, an electrode pad that is formed on the main surface, a rewiring that is connected to the electrode pad and that is formed on the main surface such as to be drawn out to a region outside the electrode pad, a post electrode having a first electrode surface connected to the rewiring, a second electrode surface positioned on a side opposite to the first electrode surface, and an electrode lateral surface that connects the first electrode surface and the second electrode surface together and that is roughened, and a resin that exposes the second electrode surface on the main surface and that seals the rewiring and the post electrode such as to cover the electrode lateral surface.

According to this semiconductor device, it is possible to raise the adhesive force of the resin with respect to the post electrode by the roughened electrode lateral surface. Therefore, it is possible to provide the semiconductor device capable of preventing the peel-off of the resin.

The aforementioned or still other objects, features, and effects of the present invention will be clarified by the following description of preferred embodiments given below with reference to the accompanying drawings.

BRIEF DESCRIPTION OF DRAWINGS

FIG. 10A is a cross-sectional view to describe an example of a method of manufacturing the semiconductor device shown in FIG. 1.

FIG. 10C is a cross-sectional view showing a step subsequent to that of FIG. 10B.

FIG. 10E is a cross-sectional view showing a step subsequent to that of FIG. 10D.

FIG. 10I is a cross-sectional view showing a step subsequent to that of FIG. 10H.

FIG. 10L is a cross-sectional view showing a step subsequent to that of FIG. 10K.

FIG. 10M is a cross-sectional view showing a step subsequent to that of FIG. 10L.

FIG. 10N is a cross-sectional view showing a step subsequent to that of FIG. 10M.

FIG. 10O is a cross-sectional view showing a step subsequent to that of FIG. 10N.

FIG. 10R is a cross-sectional view showing a step subsequent to that of FIG. 10Q.

FIG. 13 is an enlarged view of region XIII of FIG. 12.
FIG. 14 is an enlarged view of region XIV of FIG. 13.

DESCRIPTION OF EMBODIMENTS

Figure 1:
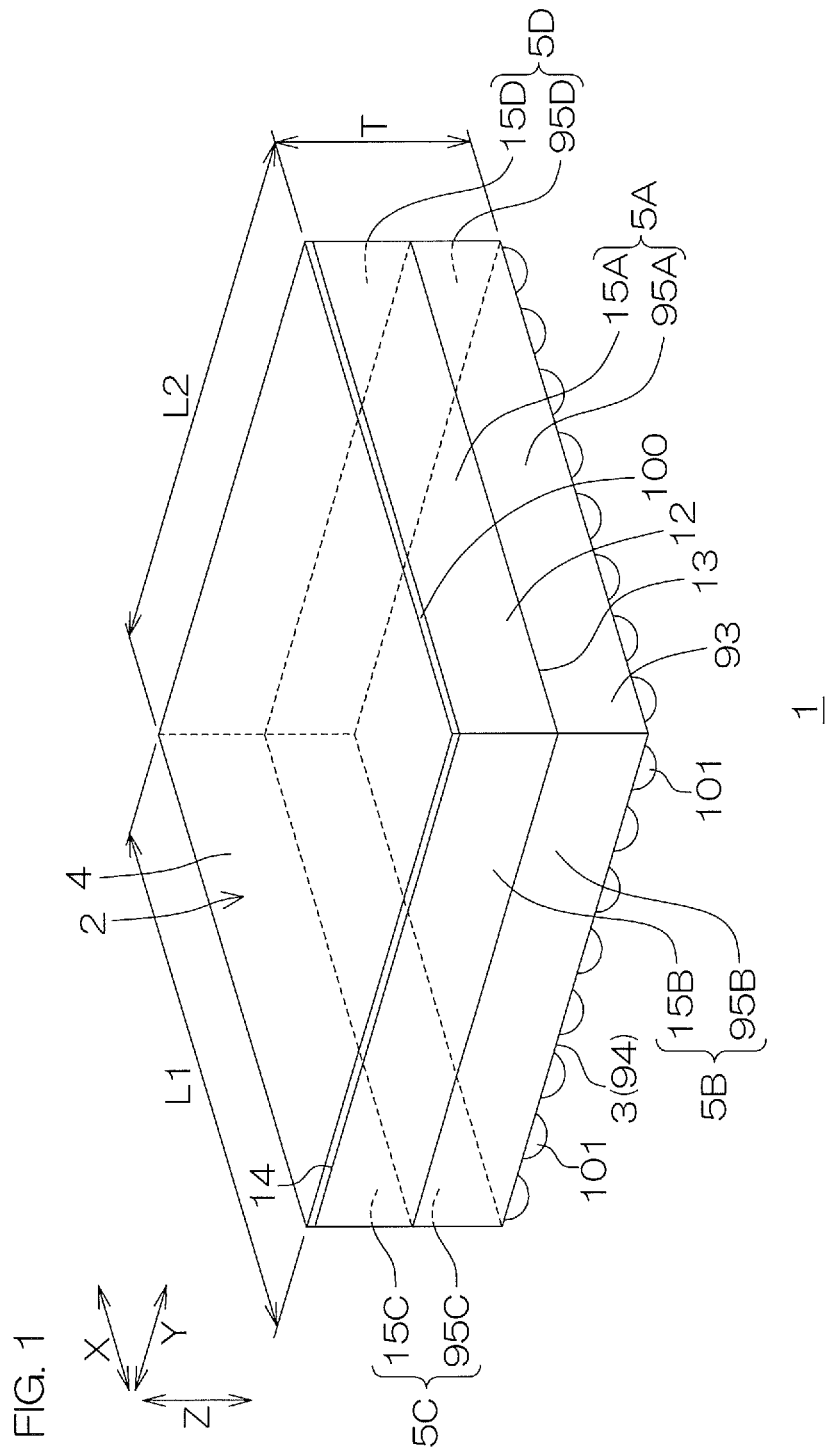
FIG. 1 is a schematic perspective view of a semiconductor device according to a first preferred embodiment of the present invention.
Figure 2:
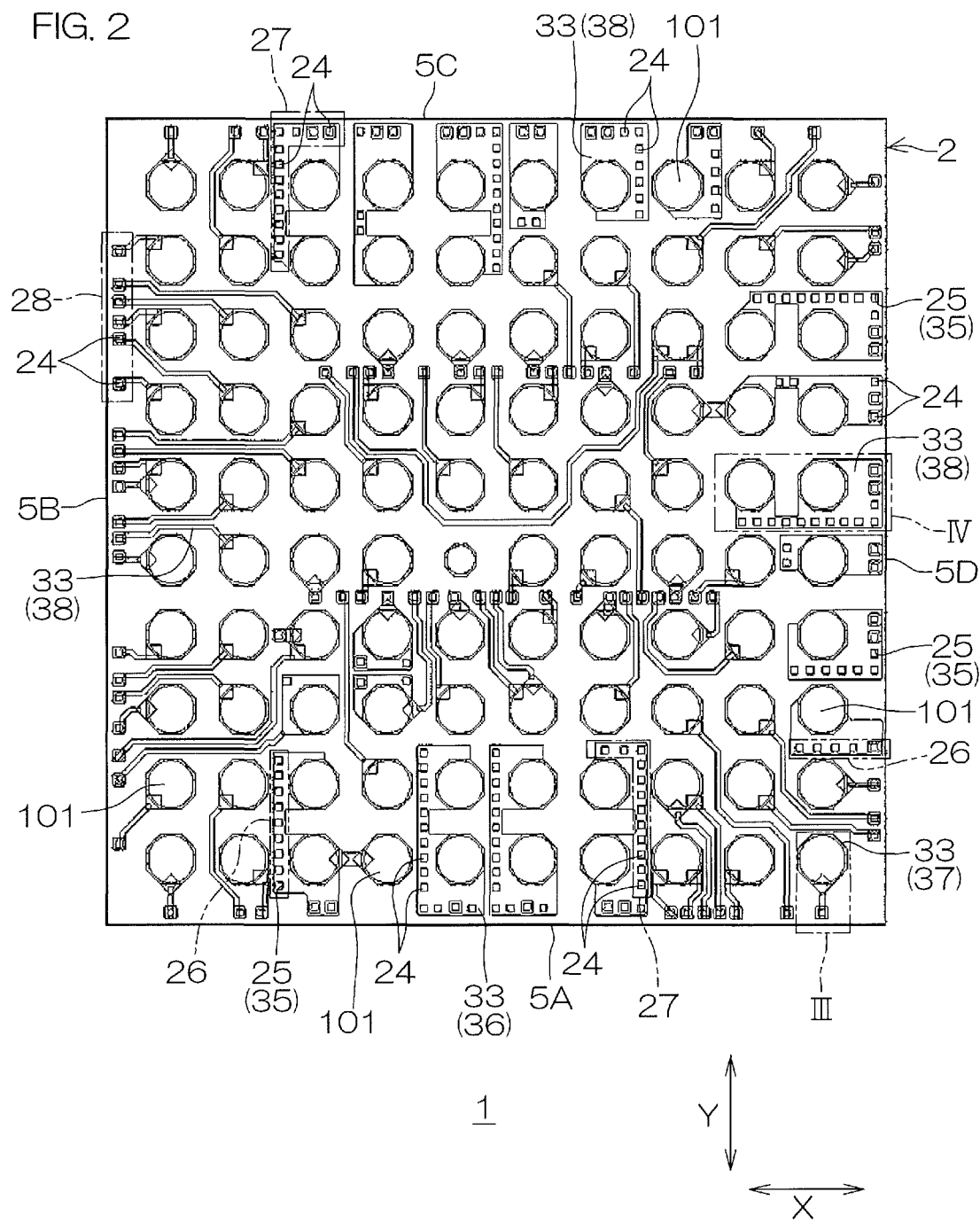
FIG. 2 is a plan view of a structure on a first main surface of a semiconductor layer shown in FIG. 1, which is seen through a sealing resin layer.
Figure 3:
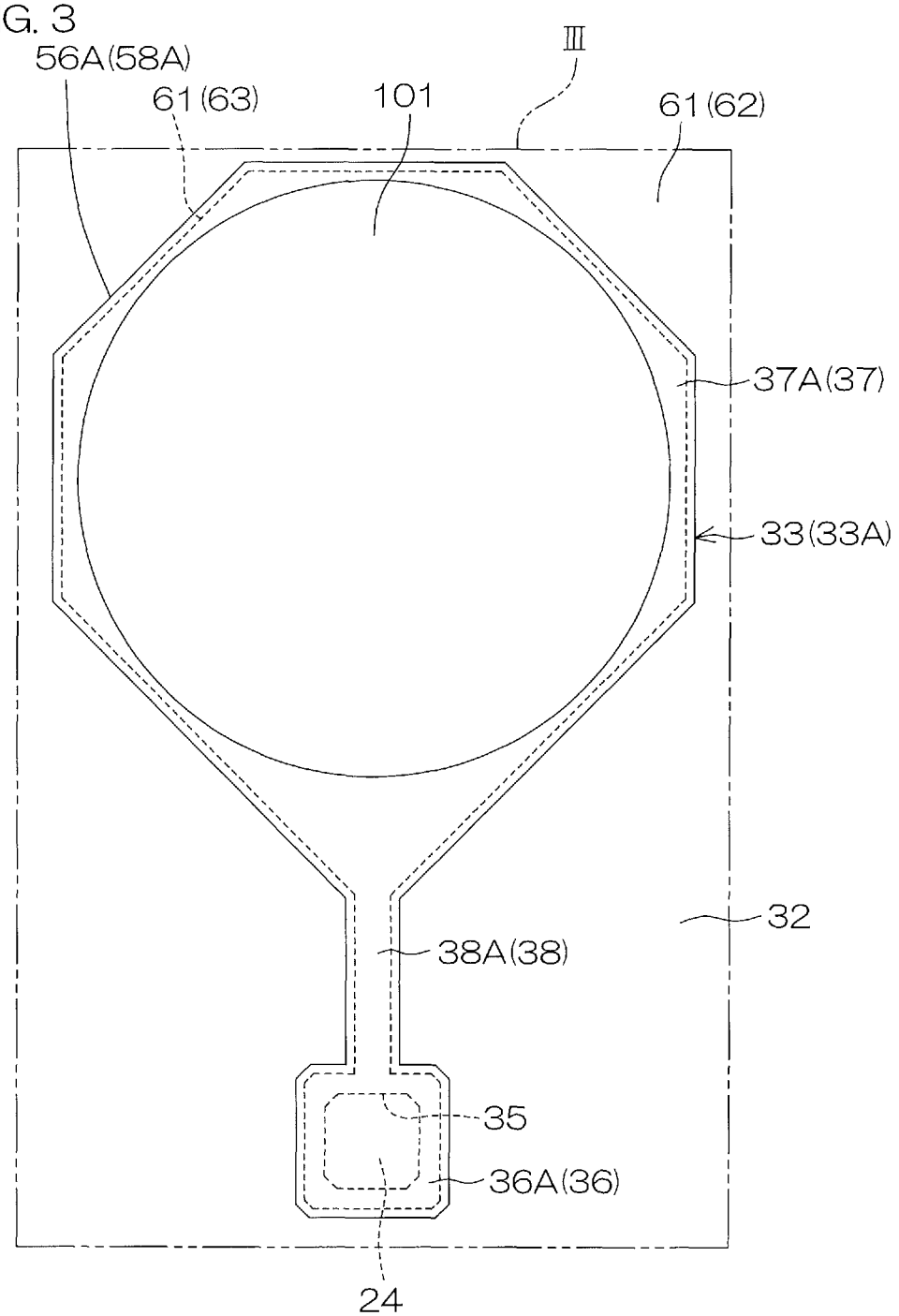
FIG. 3 is an enlarged view of region III shown in FIG. 2.
Figure 4:
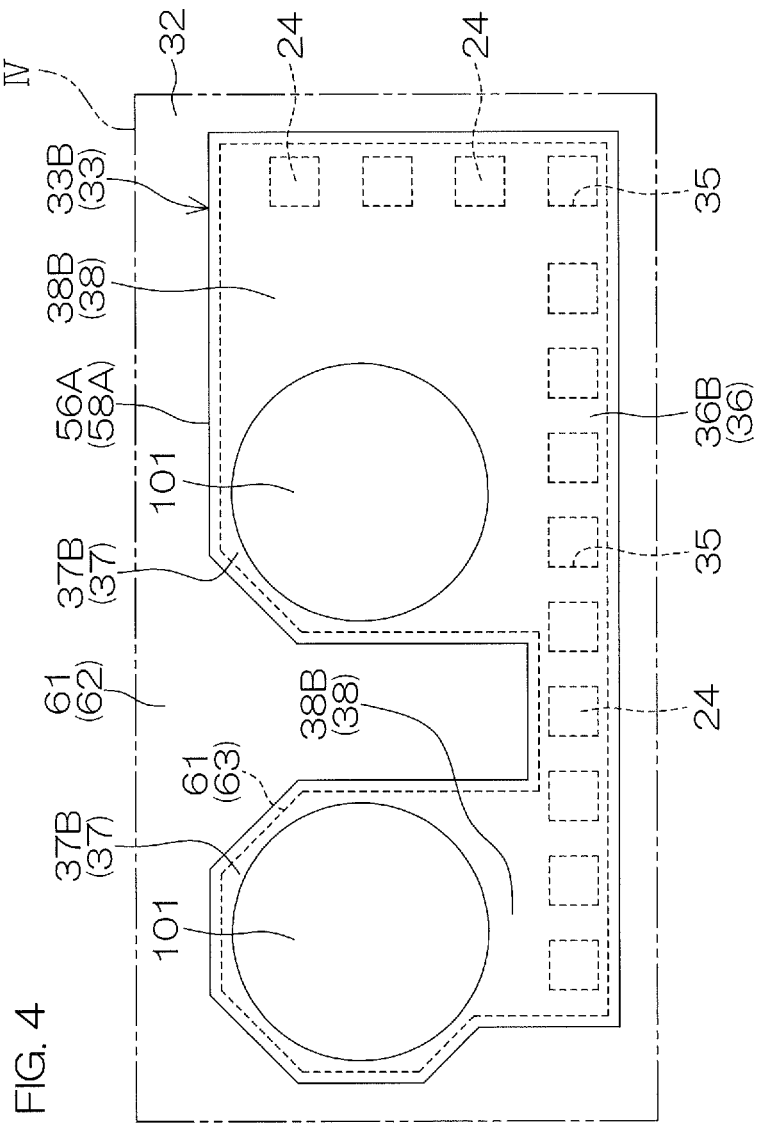
FIG. 4 is an enlarged view of region IV shown in FIG. 2.
Figure 5:
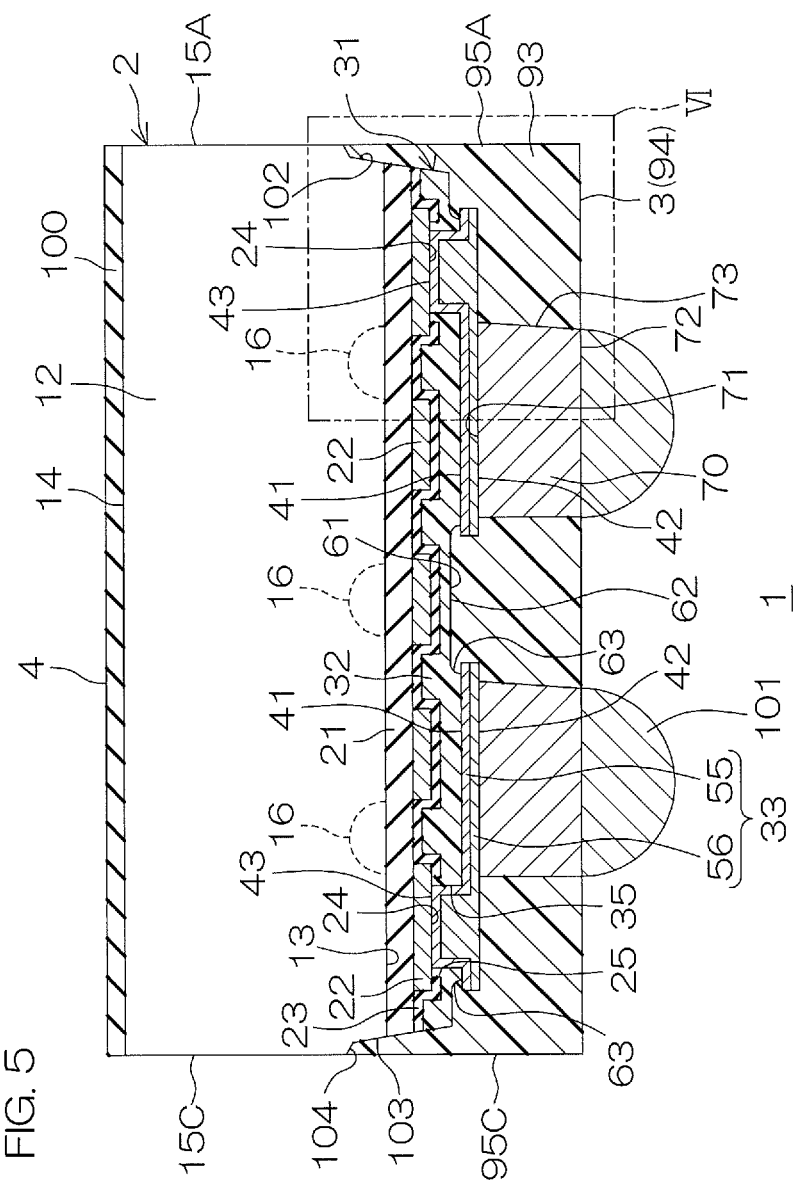
FIG. 5 is a schematic cross-sectional view of the semiconductor device shown in FIG. 1.
Figure 6:
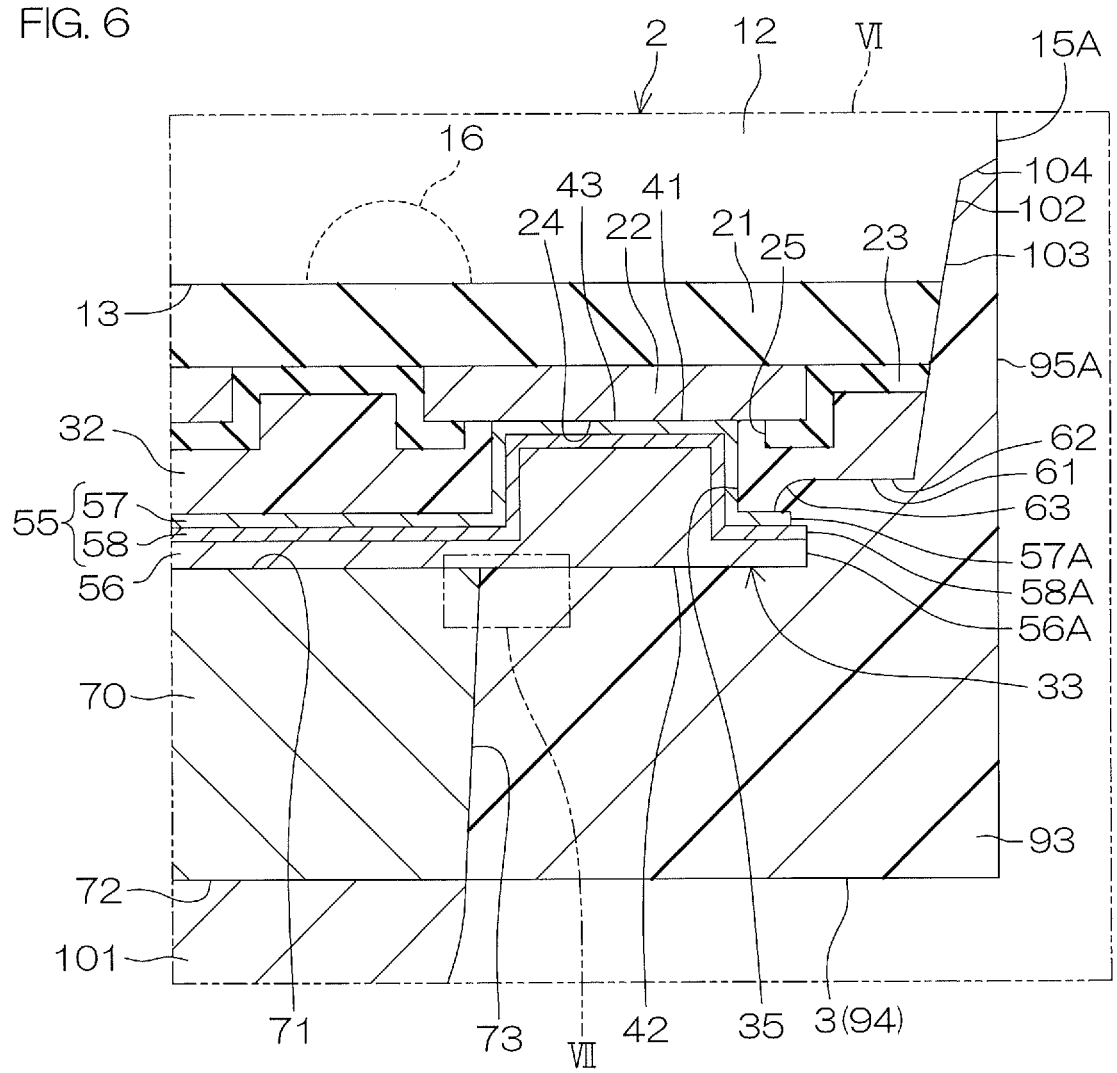
FIG. 6 is an enlarged view of region VI of FIG. 5.
Figure 7:
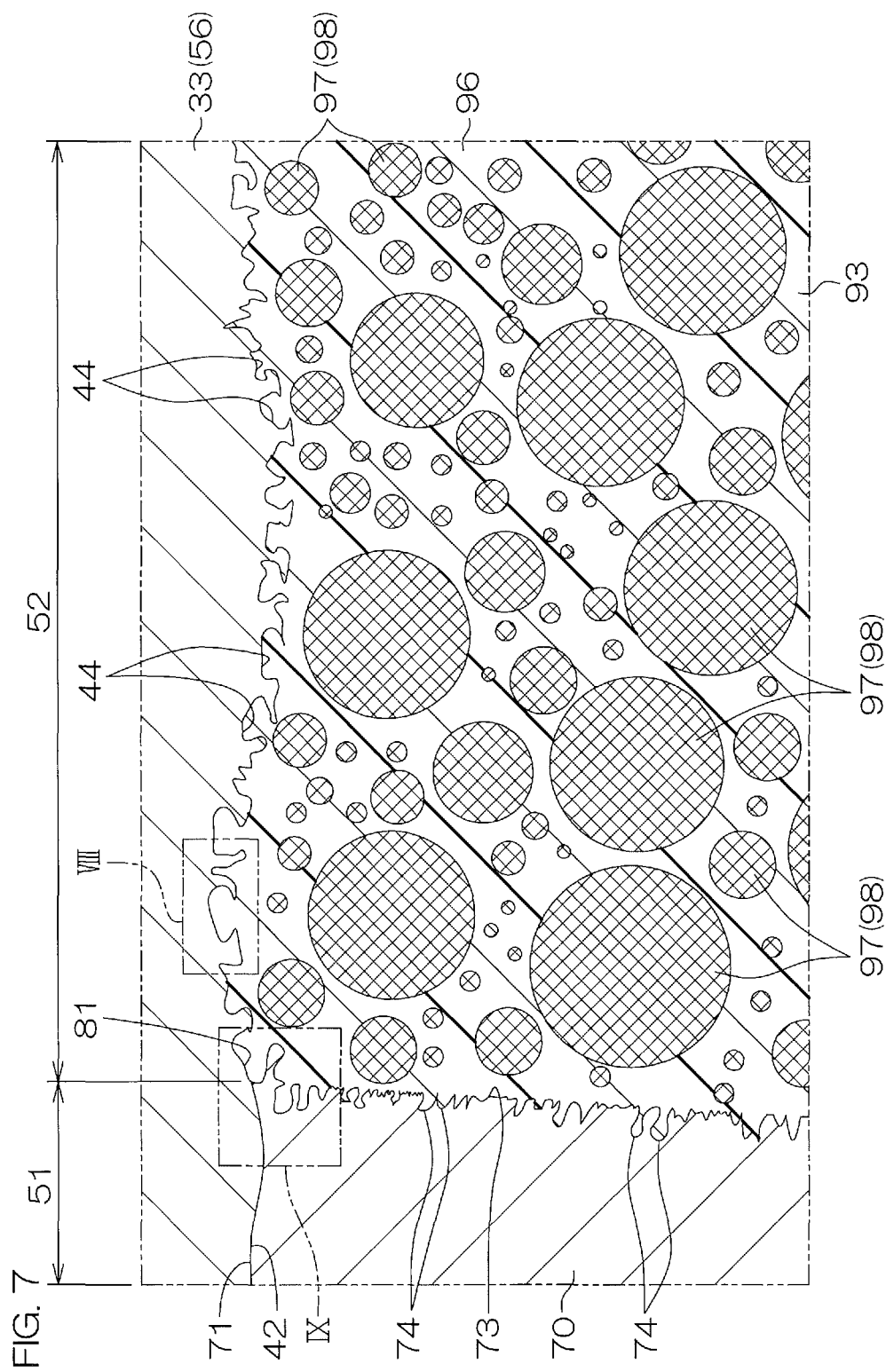
FIG. 7 is an enlarged view of region VII of FIG. 6.
Figure 8:
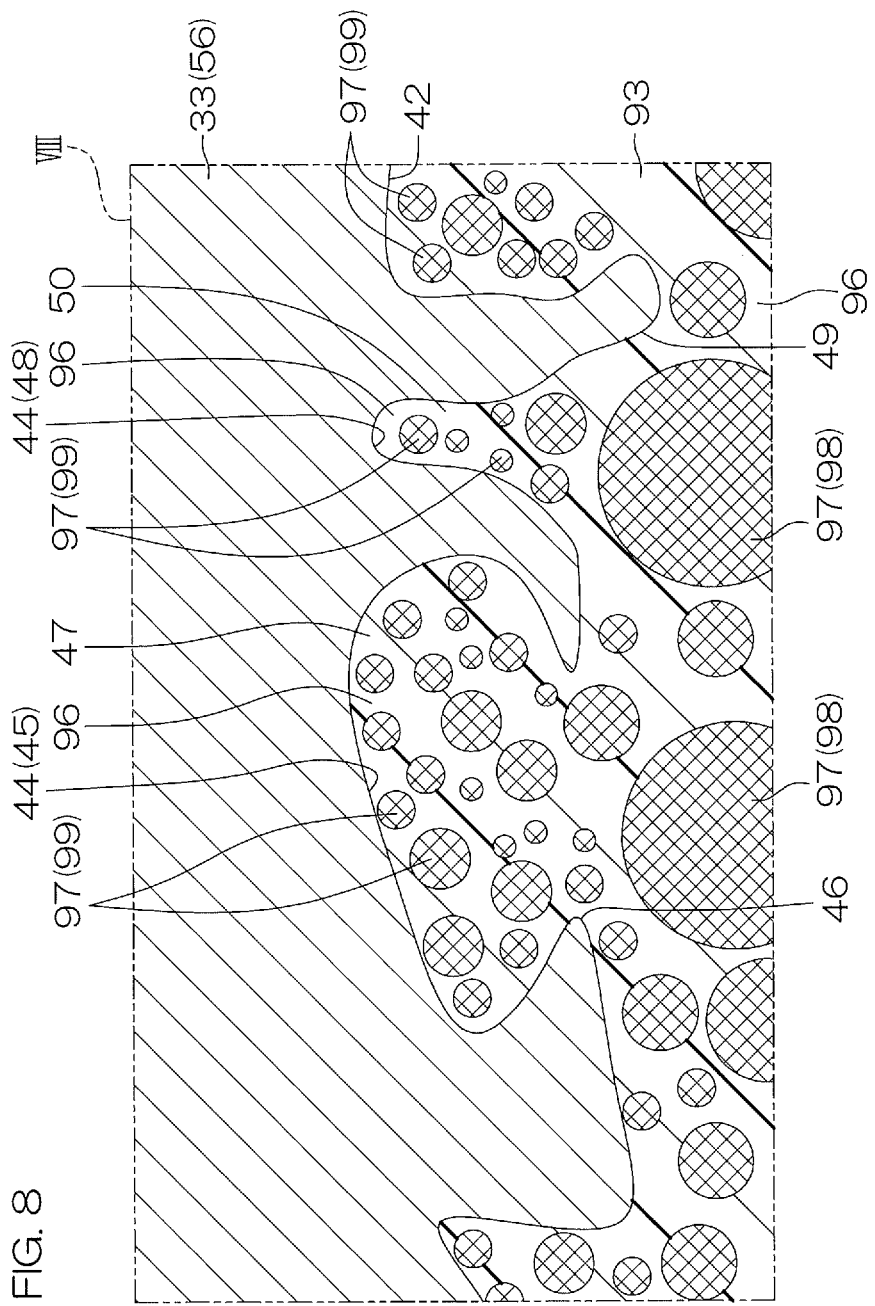
FIG. 8 is an enlarged view of region VIII of FIG. 7.
Figure 9:
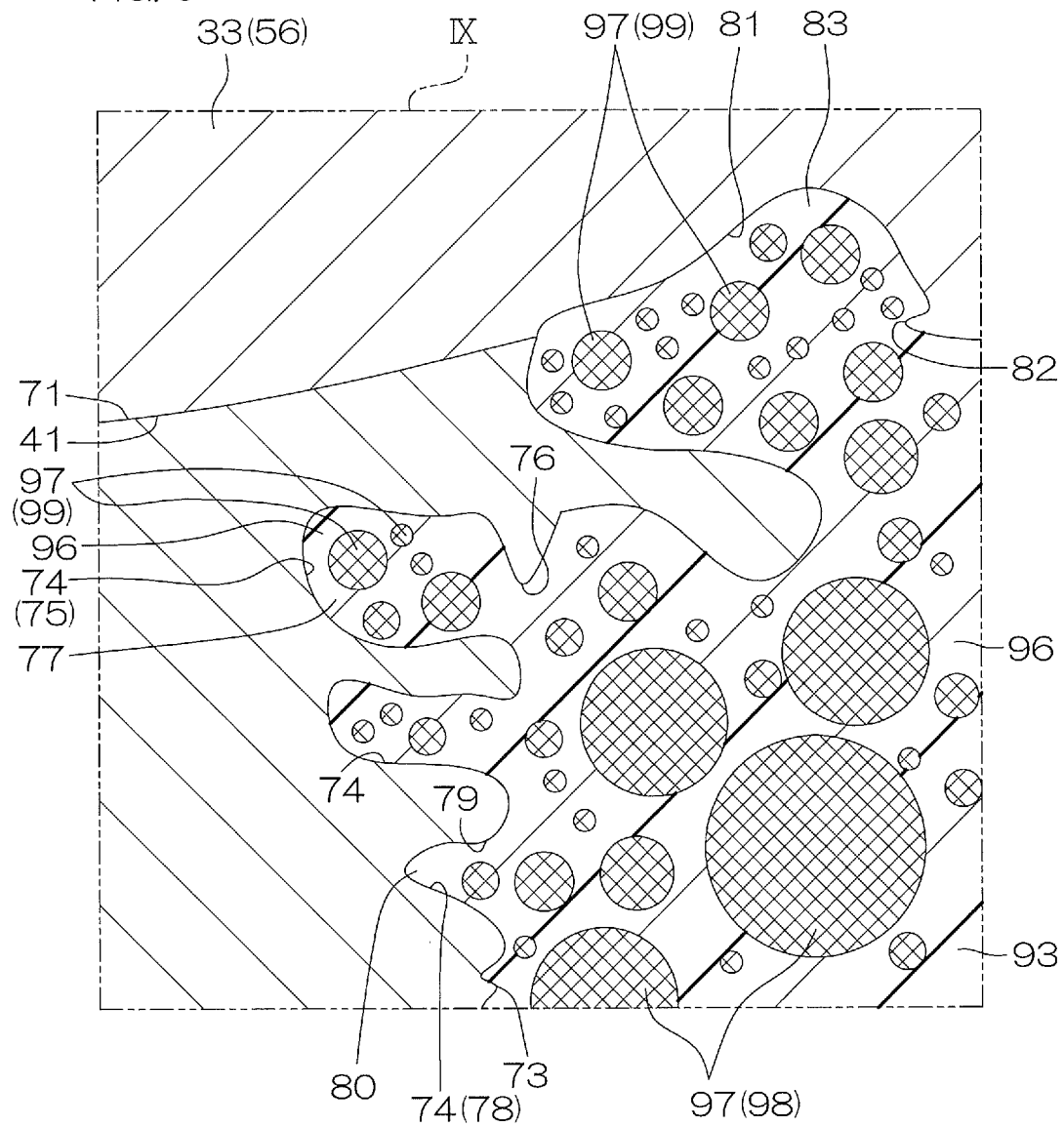
FIG. 9 is an enlarged view of region IX of FIG. 7.

FIG. 1 is a schematic perspective view of a semiconductor device 1 according to a first preferred embodiment of the present invention. FIG. 2 is a plan view of a structure on a first main surface 13 of a semiconductor layer 12 shown in FIG. 1, which is seen through a sealing resin layer 93. FIG. 3 is an enlarged view of region III shown in FIG. 2. FIG. 4 is an enlarged view of region IV shown in FIG. 2. FIG. 5 is a schematic cross-sectional view of the semiconductor device 1 shown in FIG. 1. FIG. 6 is an enlarged view of region VI of FIG. 5. FIG. 7 is an enlarged view of region VII of FIG. 6. FIG. 8 is an enlarged view of region VIII of FIG. 7. FIG. 9 is an enlarged view of region IX of FIG. 7. FIG. 5 does not show a cross section of a specific place of the semiconductor device 1, but schematically shows a configuration necessary for description.

Referring to FIG. 1 to FIG. 5, the semiconductor device 1 is an electronic component in which a WL-CSP (Wafer Level-Chip Size Package) is used as a package type. The semiconductor device 1 includes a device body 2 formed in a rectangular parallelepiped shape. The device body 2 has a first device main surface 3 on one side, a second device main surface 4 on the other side, and device lateral surfaces 5A, 5B, 5C, and 5D by which the first device main surface 3 and the second device main surface 4 are connected together.

The first device main surface 3 and the second device main surface 4 are each formed in a quadrangular shape (in this embodiment, a square shape) in a plan view seen from a normal direction Z of these main surfaces (hereinafter, referred to simply as a "plan view"). In this embodiment, when the first device main surface 3 is to be mounted on a connected object, such as a mount board, the first device main surface 3 is formed as a mounting surface that faces the mount board.

The device lateral surfaces 5A to 5D flatly extend along the normal direction Z. The device lateral surface 5A and the device lateral surface 5C extend along a first direction X, and face each other in a second direction Y that intersects the first direction X. The device lateral surface 5B and the device lateral surface 5D extend along the second direction Y, and face each other in the first direction X. More specifically, the second direction Y perpendicularly intersects the first direction X.

The length L1 of the device lateral surface 5A and the length L1 of the device lateral surface 5C may be not less than 0.1 mm and not more than 10 mm. The length L1 may be not less than 0.1 mm and not more than 2 mm, not less than 2 mm and not more than 4 mm, not less than 4 mm and not more than 6 mm, not less than 6 mm and not more than 8 mm, or not less than 8 mm and not more than 10 mm.

The length L2 of the device lateral surface 5B and the length L2 of the device lateral surface 5D may be not less than 0.1 mm and not more than 10 mm. The length L1 may be not less than 0.1 mm and not more than 2 mm, not less than 2 mm and not more than 4 mm, not less than 4 mm and not more than 6 mm, not less than 6 mm and not more than 8 mm, or not less than 8 mm and not more than 10 mm.

The thickness T of the device body 2 may be not less than 100 μm and not more than 1500 μm. The thickness T may be not less than 100 μm and not more than 250 μm, not less than 250 μm and not more than 500 μm, not less than 500 μm and not more than 750 μm, not less than 750 μm and not more than 1000 μm, not less than 1000 μm and not more than 1250 μm, or not less than 1250 μm and not more than 1500 μm.

The device body 2 includes a semiconductor layer 12. The semiconductor layer 12 is formed in a rectangular parallelepiped shape. The semiconductor layer 12 may be a Si semiconductor layer that includes Si (silicon). The Si semiconductor layer may have a laminated structure that includes a Si semiconductor substrate and a Si epitaxial layer. The Si semiconductor layer may have a single layer structure consisting of a Si semiconductor substrate.

The semiconductor layer 12 may be a wide bandgap semiconductor layer that includes a wide bandgap semiconductor material having a bandgap of 2.0 eV or more. The semiconductor layer 12 may be a SiC semiconductor layer that includes SiC (silicon carbide) that is an example of the wide bandgap semiconductor material. The SiC semiconductor layer may have a laminated structure that includes a SiC semiconductor substrate and a SiC epitaxial layer. The SiC semiconductor layer may have a single layer structure consisting of a SiC semiconductor substrate.

The semiconductor layer 12 may be a compound semiconductor layer that includes a compound semiconductive material. The compound semiconductor layer may have a laminated structure that includes a compound semiconductor substrate and a compound semiconductor epitaxial layer. The compound semiconductor layer may have a single layer structure consisting of a compound semiconductor substrate. The compound semiconductive material may be a III-V compound semiconductor material. The III-V compound semiconductor material may include at least one among AlN (aluminum nitride), InN (indium nitride), GaN (gallium nitride), and GaAs (gallium arsenide).

The semiconductor layer 12 includes a first main surface 13 on one side, a second main surface 14 on the other side, lateral surfaces 15A, 15B, 15C, and 15D by which the first main surface 13 and the second main surface 14 are connected together. The lateral surfaces 15A to 15D each form a part of the device lateral surfaces 5A to 5D. The lateral surfaces 15A to 15D are each a ground surface in this embodiment.

The thickness of the semiconductor layer 12 may be not less than 50 μm and not more than 1000 μm. The thickness of the semiconductor layer 12 may be not less than 50 μm and not more than 200 μm, not less than 200 μm and not more than 400 μm, not less than 400 μm and not more than 600 μm, not less than 600 μm and not more than 800 μm, or not less than 800 μm and not more than 1000 μm.

The first main surface 13 is formed as a device formation surface on which a main structure for a functional device 16 is formed. The functional device 16 is formed by using a surface layer portion of the first main surface 13 of the semiconductor layer 12 and/or a region on the first main surface 13 of the semiconductor layer 12. In FIG. 5, the functional device 16 is depicted in a simplified form by a broken line shown in the surface layer portion of the first main surface 13 of the semiconductor layer 12.

The functional device 16 may include at least one among a passive device, a semiconductor rectifier device, and a semiconductor switching device. The passive device may include a semiconductor passive device. The passive device (semiconductor passive device) may include at least one among a resistor, a capacitor, and a coil. The semiconductor rectifier device may include at least one among a pn junction diode, a Zener diode, a Schottky barrier diode, and a fast-recovery diode.

The semiconductor switching device may include at least one among a BJT (Bipolar Junction Transistor), a MISFET (Metal Insulator Field Effect Transistor), an IGBT (Insulated Gate Bipolar Junction Transistor), and a JFET (Junction Field Effect Transistor).

The functional device 16 may include a circuit network in which two or more arbitrary devices among the passive device (semiconductor passive device), the semiconductor rectifier device, and the semiconductor switching device are selectively combined together. The circuit network may form a part of or all of an integrated circuit. The integrated circuit may include an SSI (Small Scale Integration), an LSI (Large Scale Integration), an MSI (Medium Scale Integration), a VLSI (Very Large Scale Integration), or an ULSI (Ultra-Very Large Scale Integration).

The device body 2 includes a main surface insulation layer 21. The main surface insulation layer 21 covers the first main surface 13 of the semiconductor layer 12. The main surface insulation layer 21 may have a single layer structure consisting of a single insulation layer. The main surface insulation layer 21 may have a laminated structure in which a plurality of insulation layers are laminated. The single or the plurality of insulation layers that is/are each used as the main surface insulation layer 21 may include a silicon oxide layer and/or a silicon nitride layer.

The main surface insulation layer 21 may have a multi-layer wiring structure. The multilayer wiring structure may include a plurality of insulation layers and one or more wiring layers that is/are selectively interposed in a region between the plurality of insulation layers. The plurality of wiring layers are electrically connected to the functional device 16.

The device body 2 includes a plurality of wiring electrodes 22 formed on the main surface insulation layer 21. The plurality of wiring electrodes 22 are selectively drawn around on the main surface insulation layer 21, respectively. The plurality of wiring electrodes 22 are electrically connected to the functional device 16. The plurality of wiring electrodes 22 may include one or more wiring electrodes 22 that is/are electrically opened. The planar shape of each of the plurality of wiring electrodes 22 is arbitrary, and is not limited to a specific shape.

Each of the wiring electrodes 22 may include at least one among aluminum, copper, an aluminum alloy, and a copper alloy. The wiring electrode 22 may include at least one among an Al—Si—Cu (aluminum silicon copper) alloy, an Al—Si (aluminum silicon) alloy, and an Al—Cu (aluminum copper) alloy. It is preferred that the wiring electrode 22 includes aluminum.

Referring to FIG. 5, the device body 2 includes a protective insulation layer 23. The protective insulation layer 23 collectively covers the plurality of wiring electrodes 22 on the main surface insulation layer 21. The protective insulation layer 23 protects a lower-layer structure including the plurality of wiring electrodes 22 and so on. The protective insulation layer 23 is referred to also as a passivation layer.

The protective insulation layer 23 may have a single layer structure consisting of a single insulation layer. The protective insulation layer 23 may have a laminated structure in which a plurality of insulation layers are laminated. The single or the plurality of insulation layers that is/are each used as the protective insulation layer 23 may include a silicon oxide layer and/or a silicon nitride layer. The protective insulation layer 23 has a single layer structure consisting of a silicon nitride layer in this embodiment.

The protective insulation layer 23 has a plurality of first pad openings 25. The plurality of first pad openings 25 expose regions of part of the plurality of wiring electrodes 22 as electrode pads 24, respectively. The planar shape of each of the first pad openings 25 is arbitrary, and is not limited to a specific shape. Each of the first pad openings 25 may be formed in a polygonal shape, such as a triangular shape, a quadrangular shape, or a hexagonal shape or may be formed in a circular shape or an elliptical shape in a plan view.

The plurality of electrode pads 24 may be arranged regularly or irregularly. The plurality of electrode pads 24 may form a plurality of groups in accordance with its arrangement. FIG. 2 shows an embodiment in which the plurality of electrode pads 24 include a first electrode pad group 26, a second electrode pad group 27, and a third electrode pad group 28.

The first electrode pad group 26 includes a plurality of electrode pads 24 arranged in a line with equal intervals between the electrode pads 24 along the first direction X or along the second direction Y. The second electrode pad group 27 includes a plurality of electrode pads 24 arranged in a line with equal intervals between the electrode pads 24 along the first direction X, and includes a plurality of electrode pads 24 arranged in a line with equal intervals between the electrode pads 24 along the second direction Y. The third electrode pad group 28 includes a plurality of electrode pads 24 arranged irregularly with mutually different intervals between the electrode pads 24.

The device body 2 includes a rewiring structure 31. The rewiring structure 31 covers the plurality of wiring electrodes 22 on the main surface insulation layer 21. The rewiring structure 31 includes an underlayer 32 and a plurality of rewiring layers 33 (rewiring) in this embodiment.

The underlayer 32 covers the plurality of wiring electrodes 22 on the protective insulation layer 23. The underlayer 32 has a plurality of second pad openings 35. The plurality of second pad openings 35 expose corresponding electrode pads 24, respectively. More specifically, the plurality of second pad openings 35 expose corresponding electrode pads 24, respectively, in a one-to-one correspondence.

The planar shape of each of the second pad openings 35 is arbitrary, and is not limited to a specific shape. Each of the second pad openings 35 may be formed in a polygonal shape, such as a triangular shape, a quadrangular shape, or a hexagonal shape or may be formed in a circular shape or an elliptical shape in a plan view.

Each of the second pad openings 35 includes an inner wall positioned in a region surrounded by an inner wall of each of the first pad openings 25 in this embodiment. In other words, the underlayer 32 enters each of the first pad openings 25 from above the protective insulation layer 23, and exposes each of the electrode pads 24 in this embodiment. The underlayer 32 covers the inner wall of each of the first pad openings 25 and a part of each of the electrode pads 24 inside each of the first pad openings 25.

The inner wall of each of the second pad openings 35 may lead to the inner wall of each of the first pad openings 25. In this case, the inner wall of each of the second pad openings 35 may be formed such as to be flush with the inner wall of each of the first pad openings 25, or may be formed outside the inner wall of each of the first pad openings 25.

The underlayer 32 includes an organic insulating material. In this embodiment, the underlayer 32 includes a photosensitive resin that is an example of the organic insulating material. The underlayer 32 may include a polyimide resin that is an example of a negative type photosensitive resin.

The underlayer 32 may include polybenzoxazole that is an example of a positive type photosensitive resin.

The thickness of the underlayer 32 may be not less than 1 μm and not more than 20 μm. The thickness of the underlayer 32 may be not less than 1 μm and not more than 5 μm, not less than 5 μm and not more than 10 μm, not less than 10 μm and not more than 15 μm, or not less than 15 μm and not more than 20 μm.

Each of the rewiring layers 33 is connected to the electrode pad 24 corresponding thereto. Each of the rewiring layers 33 is drawn out from the corresponding electrode pad 24 onto the underlayer 32. Most of each of the rewiring layers 33 is positioned in a region outside the corresponding electrode pad 24.

More specifically, each of the rewiring layers 33 has a pad connection portion 36, an electrode connection portion 37, and a wiring portion 38. The pad connection portion 36 covers the electrode pad 24, and is electrically connected to the electrode pad 24 in the second pad opening 35. The planar shape of the pad connection portion 36 is arbitrary, and is not limited to a specific shape.

The electrode connection portion 37 is formed on the underlayer 32 away from the pad connection portion 36. The electrode connection portion 37 has a plane area that exceeds the plane area of the electrode pad 24. The planar shape of the electrode connection portion 37 is arbitrary, and is not limited to a specific shape.

The wiring portion 38 connects the pad connection portion 36 and the electrode connection portion 37 together. The wiring portion 38 extends in a region between the pad connection portion 36 and the electrode connection portion 37. The planar shape of the wiring portion 38 is arbitrary, and is not limited to a specific shape.

The plurality of rewiring layers 33 may have a plurality of designations in accordance with the connection mode with the electrode pad 24. Referring to FIG. 2 to FIG. 4, the plurality of rewiring layers 33 may include a first rewiring layer 33A and a second rewiring layer 33B. The first rewiring layer 33A is connected to only one electrode pad 24. The second rewiring layer 33B is connected to two or more electrode pads 24.

Referring to FIG. 3, the first rewiring layer 33A includes a first pad connection portion 36A, a first electrode connection portion 37A, and a first wiring portion 38A. The first pad connection portion 36A covers one electrode pad 24 corresponding thereto, and is electrically connected to this electrode pad 24 in the second pad opening 35. The planar shape of the first pad connection portion 36A is arbitrary, and is not limited to a specific shape. The first pad connection portion 36A may be formed in a polygonal shape, such as a triangular shape, a quadrangular shape, or a hexagonal shape or may be formed in a circular shape or an elliptical shape in a plan view.

The first electrode connection portion 37A is formed on the underlayer 32 away from the first pad connection portion 36A. The first electrode connection portion 37A has a plane area that exceeds the plane area of one electrode pad 24 corresponding thereto. The planar shape of the first electrode connection portion 37A is arbitrary, and is not limited to a specific shape. The first electrode connection portion 37A may be formed in a polygonal shape, such as a triangular shape, a quadrangular shape, or a hexagonal shape or may be formed in a circular shape or an elliptical shape in a plan view.

The first wiring portion 38A connects the first pad connection portion 36A and the first electrode connection portion 37A together. The first wiring portion 38A extends in a region between the first pad connection portion 36A and the first electrode connection portion 37A. The planar shape of the first wiring portion 38A is arbitrary, and is not limited to a specific shape. The first wiring portion 38A may extend in a belt shape, in a linear shape, in an L shape, or in a zigzag shape in the region between the first pad connection portion 36A and the first electrode connection portion 37A.

The first wiring portion 38A may cross other rewiring layers 33 along the first direction X and/or the second direction Y. The first wiring portion 38A may extend so as not to cross other rewiring layers 33 along the first direction X and/or the second direction Y. The first pad connection portion 36A, the first electrode connection portion 37A, and the first wiring portion 38A may be formed in a polygonal shape as a whole without allowing their respective planar shapes to be distinguished from each other.

Referring to FIG. 4, the second rewiring layer 33B has a second pad connection portion 36B, a second electrode connection portion 37B, and a second wiring portion 38B. In this embodiment, the second rewiring layer 33B includes a plurality of (in this embodiment, two) second electrode connection portions 37B and a plurality of (in this embodiment, two) second wiring portions 38B.

The second pad connection portion 36B collectively covers the plurality of electrode pads 24 corresponding thereto. The second pad connection portion 36B is electrically connected to the corresponding electrode pads 24 in the plurality of second pad openings 35 corresponding thereto. The planar shape of the second pad connection portion 36B is arbitrary, and is not limited to a specific shape.

The plurality of second electrode connection portions 37B are each formed on the underlayer 32 away from the second pad connection portion 36B. Each of the second electrode connection portions 37B has a plane area that exceeds the plane area of the electrode pad 24. The planar shape of each of the second electrode connection portions 37B is arbitrary, and is not limited to a specific shape.

The plurality of second wiring portions 38B each connect the second pad connection portion 36B and the corresponding second electrode connection portion 37B together. Each of the second wiring portions 38B extends in a region between the second pad connection portion 36B and the corresponding second electrode connection portion 37B. The planar shape of each of the second wiring portions 38B is arbitrary, and is not limited to a specific shape. Each of the second wiring portions 38B may extend in a belt shape, in a linear shape, in an L shape, or in a zigzag shape in the region between the second pad connection portion 36B and the corresponding second electrode connection portion 37B.

Each of the second wiring portions 38B may cross other rewiring layers 33 along the first direction X and/or the second direction Y. Each of the second wiring portions 38B may extend so as not to cross other rewiring layers 33 along the first direction X and/or the second direction Y. The second pad connection portion 36B, the second electrode connection portion 37B, and the second wiring portion 38B may be formed in a polygonal shape as a whole without allowing their respective planar shapes to be distinguished from each other.

Referring to FIG. 5 to FIG. 8, each of the rewiring layers 33 includes a first wiring surface 41 on the semiconductor-layer-12 side and a second wiring surface 42 positioned on the side opposite to the first wiring surface 41. The first wiring surface 41 has a single or a plurality of contact portions 43 that is/are connected to the single or the plurality of electrode pads 24 corresponding thereto.

The second wiring surface 42 is roughened. The second wiring surface 42 has a first arithmetic mean roughness Ra1. The first arithmetic mean roughness Ra1 is defined by Formula (1) mentioned below.

[Formula 1]

$$Ra1 = \frac{1}{L1} \int_0^{L1} |f(a)| da \quad (1)$$

In Formula (1) mentioned above, "L1" is an arbitrary length extracted from a roughness curve formed in the second wiring surface 42 in a direction along an average line of the roughness curve. Under the condition that an a-axis is set in the direction along the average line and that a z-axis is set in a normal direction Z, "f(a)" is a function of the roughness curve represented by the a-axis and the z-axis (z=f(a)). The unit of the first arithmetic mean roughness Ra1 is "µm."

The first arithmetic mean roughness Ra1 may be not less than 0.5 µm and not more than 2 µm. The first arithmetic mean roughness Ra1 may be not less than 0.5 µm and not more than 0.75 µm, not less than 0.75 µm and not more than 1 µm, not less than 1 µm and not more than 1.25 µm, not less than 1.25 µm and not more than 1.5 µm, not less than 1.5 µm and not more than 1.75 µm, or not less than 1.75 µm and not more than 2 µm. Preferably, the first arithmetic mean roughness Ra1 is not less than 0.65 µm and not more than 1.3 µm.

More specifically, the second wiring surface 42 includes a plurality of wiring recesses 44, and is roughened by the plurality of wiring recesses 44. The plurality of wiring recesses 44 are each hollowed from the second wiring surface 42 toward the first wiring surface 41 in an irregular shape. Hence, an irregular uneven structure is formed at the second wiring surface 42.

Referring to FIG. 7 and FIG. 8, the plurality of wiring recesses 44 may include a single or a plurality of club-shaped recesses 45. The club-shaped recess 45 has an opening edge 46 and an internal space 47 whose opening width spreads from the opening edge 46 toward the first wiring surface 41. The plurality of wiring recesses 44 may include a single or a plurality of tapered recesses 48. The tapered recess 48 has an opening edge 49 and an internal space 50 whose opening width becomes gradually narrower from the opening edge 49 toward the first wiring surface 41.

Referring to FIG. 7, the second wiring surface 42 includes a rough surface region 51 (first region) that is roughened and a non-rough surface region 52 (second region) whose surface roughness is smaller than the rough surface region 51. The rough surface region 51 includes a plurality of wiring recesses 44, and has a first arithmetic mean roughness Ra1. The non-rough surface region 52 is a region that does not include the wiring recess 44. The non-rough surface region 52 has an arithmetic mean roughness less than the first arithmetic mean roughness Ra1 (less than 0.5 µm).

The rough surface region 51 is formed at the second wiring surface 42 of the pad connection portion 36, of the electrode connection portion 37, and of the wiring portion 38. The non-rough surface region 52 is formed in a region in which a post electrode 70 (described later) is connected in the second wiring surface 42 of the electrode connection portion 37. In this embodiment, the rough surface region 51 is formed in the whole of a region excluding the non-rough surface region 52.

Referring to FIG. 5 and FIG. 6, each of the rewiring layers 33 has a laminated structure in which a plurality of wiring layers are laminated in this embodiment. Each of the rewiring layers 33 includes an under wiring layer 55 and a body wiring layer 56 that are laminated in this order from the wiring-electrode-22 side. The under wiring layer 55 may be referred to also as UBM (Under Bump Metal).

The under wiring layer 55 forms a first wiring surface 41 of the rewiring layer 33. The under wiring layer 55 is formed in a film shape along the underlayer 32 and along the inner surface of the second pad opening 35. The under wiring layer 55 defines a concave space in the second pad opening 35.

In this embodiment, the under wiring layer 55 has a laminated structure that includes a first wiring layer 57 and a second wiring layer 58 that are laminated in this order from the wiring-electrode-22 side. The second wiring layer 58 includes a conductive material differing from that of the first wiring layer 57. The first wiring layer 57 includes a Ti layer that is composed chiefly of Ti (titanium). The Ti layer may be a Ti barrier layer. The second wiring layer 58 includes a Cu layer that is composed chiefly of Cu (copper) The Cu layer may be a Cu seed layer.

The body wiring layer 56 forms a second wiring surface 42 of the rewiring layer 33. The body wiring layer 56 is formed on the under wiring layer 55 in a film shape conforming to the under wiring layer 55. The body wiring layer 56 enters a concave space defined by the under wiring layer 55 in the second pad opening 35.

The body wiring layer 56 includes a Cu layer that is composed chiefly of Cu (copper). The body wiring layer 56 has a single layer structure including a Cu layer. The Cu layer of the body wiring layer 56 may be a Cu plated layer. The body wiring layer 56 may be formed integrally with the second wiring layer 58. The body wiring layer 56 may be formed in a mode in which an interface with the second wiring layer 58 disappears. The body wiring layer 56 may be formed in a mode in which the interface with the second wiring layer 58 remains.

Referring to FIG. 6, the first wiring layer 57 has a first circumferential edge 57A. The second wiring layer 58 has a second circumferential edge 58A that protrudes more outwardly than the first circumferential edge 57A. The body wiring layer 56 has a third circumferential edge 56A that protrudes more outwardly than the first circumferential edge 57A.

The third circumferential edge 56A of the body wiring layer 56 is continuous with the second circumferential edge 58A of the second wiring layer 58. More specifically, the third circumferential edge 56A of the body wiring layer 56 is formed such as to be flush with the second circumferential edge 58A of the second wiring layer 58. The circumferential edge of the rewiring layer 33 is formed by the first circumferential edge 57A, the second circumferential edge 58A, and the third circumferential edge 56A.

The total thickness of the rewiring layer 33 may be not less than 5 µm and not more than 15 µm. The total thickness of the rewiring layer 33 may be not less than 5 µm and not more than 7.5 µm, not less than 7.5 µm and not more than 10 µm, not less than 10 µm and not more than 12.5 µm, or not less than 12.5 µm and not more than 15 µm.

Referring to FIG. 3 to FIG. 6, an anchor recess 61 that is hollowed toward the semiconductor layer 12 is formed in the underlayer 32. The anchor recess 61 is formed at a part exposed from the rewiring layer 33 in the underlayer 32. The anchor recess 61 includes a bottom wall and a sidewall. The bottom wall of the anchor recess 61 is positioned on the first-main surface 13 side of the semiconductor layer 12 with respect to the first wiring surface 41 of the rewiring layer 33. The bottom wall of the anchor recess 61 may be formed in an uneven shape by rising and/or sinking.

In this embodiment, the sidewall of the anchor recess 61 is positioned on a more inward side of the rewiring layer 33 than the circumferential edge of the rewiring layer 33. Hence, the bottom wall of the anchor recess 61 includes an exposed portion 62 that is exposed from the rewiring layer 33 in a plan view and a concealed portion 63 that lies on the rewiring layer 33 in a plan view. The concealed portion 63 is formed over the whole circumference of the circumferential edge of each of the rewiring layers 33. The concealed portion 63 is independently formed at each of the rewiring layers 33, and has the same outline as the rewiring layer 33 in a plan view. Each of the concealed portions 63 has a curved plane that is curved toward the first main surface 13 of the semiconductor layer 12.

Referring to FIG. 5, the anchor recess 61 is formed in the whole area of a part exposed from the rewiring layer 33 in the underlayer 32, and straddles between mutually adjoining rewiring layers 33. Therefore, the concealed portion 63 of the rewiring layer 33 on one side (for example, the rewiring layer 33 on the left side of the sheet of paper of FIG. 5) and the concealed portion 63 of the rewiring layer 33 on the other side (for example, the rewiring layer 33 on the right side of the sheet of paper of FIG. 5) are continuous with each other through the exposed portion 62 shared therebetween.

The depth of the anchor recess 61 may be more than 0 μm and not more than 10 μm. The depth of the anchor recess 61 may be more than 0 μm and not more than 2 μm, not less than 2 μm and not more than 4 μm, not less than 4 μm and not more than 6 μm, not less than 6 μm and not more than 8 μm, or not less than 8 μm and not more than 10 μm. Preferably, the depth of the anchor recess 61 is not less than 1 μm and not more than 5 μm.

Referring to FIG. 2, FIG. 5, and FIG. 7, the device body 2 includes a plurality of post electrodes 70. In this embodiment, the plurality of post electrodes 70 are formed with intervals therebetween along the first direction X and along the second direction Y in a plan view. The plurality of post electrodes 70 are arranged in a matrix in a plan view.

The plurality of post electrodes 70 are each connected to the electrode connection portion 37 of the corresponding rewiring layer 33. More specifically, the plurality of post electrodes 70 are each connected to the non-rough surface region 52 in the electrode connection portion 37 of the corresponding rewiring layer 33. The single post electrode 70 is connected to the single electrode connection portion 37 of the first rewiring layer 33A. The post electrode 70 is connected to each of two electrode connection portions 37 of the second rewiring layer 33B.

The plurality of post electrodes 70 are each formed in the shape of a pillar that extends along the normal direction (normal direction Z) of the second wiring surface 42 of the rewiring layer 33. The post electrode 70 is referred to also as a pillar electrode. The plurality of post electrodes 70 may be each formed in a polygonal prism shape, such as a quadrangular prism shape or a hexagonal prism shape, or may be each formed in a cylindrical shape or an elliptic cylindrical shape. In this embodiment, the plurality of post electrodes 70 are each formed in a cylindrical shape.

Each of the plurality of post electrodes 70 has a first electrode surface 71 connected to the second wiring surface 42 in the corresponding rewiring layer 33, a second electrode surface 72 positioned on the side opposite to the first electrode surface 71, and an electrode lateral surface 73 that connects the first electrode surface 71 and the second electrode surface 72 together.

The second electrode surface 72 has a flat surface. The second electrode surface 72 is formed in parallel with the first main surface 13 of the semiconductor layer 12. More specifically, the second electrode surface 72 is a ground surface. The second electrode surface 72 functions as a mounted terminal. In other words, the second electrode surface 72 is to be connected to the connected object, such as a mount board, and, as a result, the semiconductor device 1 is to be mounted on the connected object.

The electrode lateral surface 73 flatly extends along the normal direction Z. The plurality of post electrodes 70 may include a single or a plurality of tapered post electrodes 70 that is/are each formed in a tapered shape from the second electrode surface 72 toward the first electrode surface 71. In this case, the tapered post electrode 70 has a first electrode surface 71 that has a first plane area, a second electrode surface 72 that has a second plane area exceeding the first plane area, and an electrode lateral surface 73 that is downwardly declined from the first electrode surface 71 toward the second electrode surface 72.

Referring to FIG. 5, the tapered post electrode 70 may be formed such as to be asymmetric with respect to the normal line of the first electrode surface 71 (more specifically, may be formed in a non-line-symmetric shape) in a cross-sectional view. In other words, the tapered post electrode 70 may be formed such that the inclination angle of the electrode lateral surface 73 on one side differs from the inclination angle of the electrode lateral surface 73 on the other side in a cross-sectional view. Of course, all of the post electrodes 70 may be each formed in a tapered shape.

The post electrode 70 has a thickness that exceeds the thickness of the rewiring layer 33. The ratio of the thickness of the post electrode 70 with respect to the thickness of the rewiring layer 33 may be more than 1 and not more than 30. The ratio of the thickness of the post electrode 70 with respect to the thickness of the rewiring layer 33 may be more than 1 and not more than 5, not less than 5 and not more than 10, not less than 10 and not more than 15, not less than 15 and not more than 20, not less than 20 and not more than 25, or not less than 25 and not more than 30.

The thickness of the post electrode 70 may be not less than 50 μm and not more than 150 μm. The thickness of the post electrode 70 may be not less than 50 μm and not more than 75 μm, not less than 75 μm and not more than 100 μm, not less than 100 μm and not more than 125 μm, or not less than 125 μm and not more than 150 μm. Preferably, the thickness of the post electrode 70 is not less than 90 μm and not more than 110 μm.

Referring to FIG. 7 and FIG. 9, the electrode lateral surface 73 is roughened. The electrode lateral surface 73 has a second arithmetic mean roughness Ra2. The second arithmetic mean roughness Ra2 is defined by Formula (2) mentioned below.

[Formula 2]

$$Ra2 = \frac{1}{L2}\int_0^{L2} |f(b)| db \tag{2}$$

In Formula (2) mentioned above, "L2" is an arbitrary length extracted from a roughness curve formed in the electrode lateral surface 73 in a direction along an average line of the roughness curve. Under the condition that a b-axis is set in the direction along the average line and that a ze-axis is set in a normal direction Ze, "f(b)" is a function of the roughness curve represented by the b-axis and the ze-axis (ze=f(b)). The unit of the second arithmetic mean roughness Ra2 is "μm."

The second arithmetic mean roughness Ra2 of the electrode lateral surface 73 is less than the first arithmetic mean roughness Ra1 of the second wiring surface 42 (Ra1>Ra2). The second arithmetic mean roughness Ra2 may be more than 0 μm and less than 0.5 μm. The second arithmetic mean roughness Ra2 may be more than 0 μm and not more than 0.1 μm, not less than 0.1 μm and not more than 0.2 μm, not less than 0.2 μm and not more than 0.3 μm, not less than 0.3 μm and not more than 0.4 μm, or not less than 0.4 μm and not more than 0.5 μm. Preferably, the second arithmetic mean roughness Ra2 is not less than 0.1 μm and not more than 0.3 μm.

Referring to FIG. 7 and FIG. 9, more specifically, the electrode lateral surface 73 includes a plurality of electrode recesses 74, and is roughened by the plurality of electrode recesses 74. The plurality of electrode recesses 74 are each hollowed inwardly from the electrode lateral surface 73 in an irregular shape. Hence, an irregular uneven structure is formed at the electrode lateral surface 73.

The plurality of electrode recesses 74 may include a single or a plurality of club-shaped recesses 75. The club-shaped recess 75 has an opening edge 76 and an internal space 77 whose opening width spreads inwardly from the opening edge 76. The plurality of electrode recesses 74 may include a single or a plurality of tapered recesses 78. The tapered recess 78 has an opening edge 79 and an internal space 80 whose opening width becomes gradually narrower inwardly from the opening edge 79.

The electrode lateral surface 73 may include a wiring/electrode recess 81 that is formed integrally with the wiring recess 44 in a connection portion with the second wiring surface 42. The rewiring layer 33 and the post electrode 70 are exposed from the wiring/electrode recess 81.

The wiring/electrode recess 81 includes an opening edge 82 and an internal space 83. The wiring/electrode recess 81 may have an internal space 83 that extends along a lateral direction parallel to the second wiring surface 42 from the opening edge 82. The wiring/electrode recess 81 may be a club-shaped recess that has an internal space 83 whose opening width spreads inwardly from the opening edge 82. The wiring/electrode recess 81 may be a tapered recess that has an internal space 83 whose opening width becomes gradually narrower inwardly from the opening edge 82.

The device body 2 includes a sealing resin layer 93 (resin). The sealing resin layer 93 forms the first device main surface 3. The sealing resin layer 93 collectively covers the plurality of rewiring layers 33 and the plurality of post electrodes 70 such as to expose the second electrode surface 72 of the plurality of post electrodes 70 on the first main surface 13 of the semiconductor layer 12.

The sealing resin layer 93 includes a resin main surface 94 and resin lateral surfaces 95A, 95B, 95C, and 95D. The resin main surface 94 is continuous with the second electrode surface 72 of the plurality of post electrodes 70. The resin main surface 94 is formed such as to be flush with the second electrode surface 72 of the plurality of post electrodes 70. More specifically, the resin main surface 94 forms a single ground surface between the resin main surface 94 and the second electrode surfaces 72 of the plurality of post electrodes 70.

The resin lateral surfaces 95A to 95D extend from the circumferential edge of the resin main surface 94 toward the semiconductor layer 12, and are connected to the lateral surfaces 15A to 15D. The resin lateral surfaces 95A to 95D are continuous with the lateral surfaces 15A to 15D. More specifically, the resin lateral surfaces 95A to 95D are formed such as to be flush with the lateral surfaces 15A to 15D. The resin lateral surfaces 95A to 95D form a single ground surface between the resin lateral surfaces 95A to 95D and the lateral surfaces 15A to 15D.

The thickness of the sealing resin layer 93 may be not less than 50 μm and not more than 200 μm. The thickness of the sealing resin layer 93 may be not less than 50 μm and not more than 75 μm, not less than 75 μm and not more than 100 μm, not less than 100 μm and not more than 125 μm, not less than 125 μm and not more than 150 μm, not less than 150 μm and not more than 175 μm, or not less than 175 μm and not more than 200 μm. Preferably, the thickness of the sealing resin layer 93 is not less than 100 μm and not more than 120 μm.

Referring to FIG. 7 to FIG. 9, a part with which the second wiring surface 42 of the rewiring layer 33 is covered in the sealing resin layer 93 enters the plurality of wiring recesses 44. This raises the adhesive force of the sealing resin layer 93 with respect to the plurality of rewiring layers 33. Additionally, a part with which the electrode lateral surface 73 of the post electrode 70 is covered in the sealing resin layer 93 enters the plurality of electrode recesses 74 (the wiring/electrode recesses 81). This raises the adhesive force of the sealing resin layer 93 with respect to the plurality of post electrodes 70.

Furthermore, a part with which the underlayer 32 is covered in the sealing resin layer 93 enters the anchor recess 61. This raises the adhesive force of the sealing resin layer 93 with respect to the underlayer 32. A part, which is positioned in the anchor recess 61, of the sealing resin layer 93 fills the exposed portion 62 and the concealed portion 63 of the anchor recess 61. This raises the adhesive force of the sealing resin layer 93 with respect to the underlayer 32.

The part, which is positioned in the anchor recess 61, of the sealing resin layer 93 engages with a part defined by the anchor recess 61 and by the rewiring layer 33. Also, the sealing resin layer 93 sandwiches the first wiring surface 41 and the second wiring surface 42 of the rewiring layer 33 between the inside and the outside of the anchor recess 61. This appropriately raises the adhesive force of the sealing resin layer 93 with respect to the underlayer 32.

Referring to FIG. 7 to FIG. 9, the sealing resin layer 93 includes a thermosetting resin that is an example of a molding resin. The thermosetting resin may include an epoxy resin. The sealing resin layer 93 includes a matrix resin 96 and a plurality of fillers 97 that have been added to the matrix resin 96 (that have filled the matrix resin 96). In this embodiment, the matrix resin 96 includes an epoxy resin. In this embodiment, the plurality of fillers 97 include silicon oxide, and are each formed in the shape of a particle or a ball that is non-uniform in diameter (in size).

More specifically, the plurality of fillers 97 include a plurality of large-diameter fillers 98 and a plurality of small-diameter fillers 99. The plurality of large-diameter fillers 98 include a plurality of fillers 97 the diameter of each of which exceeds the opening width of the wiring recess 44 and the opening width of the electrode recess 74. The plurality of small-diameter fillers 99 include a plurality of fillers 97 the diameter of each of which is less than the opening width of the wiring recess 44 and the opening width of the electrode recess 74.

The diameter of each of the plurality of large-diameter fillers 98 may be more than 5 μm and not more than 15 μm.

The diameter of each of the plurality of large-diameter fillers 98 may be more than 5 μm and not more than 7.5 μm, not less than 7.5 μm and not more than 10 μm, not less than 10 μm and not more than 12.5 μm, or not less than 12.5 μm and not more than 15 μm.

The diameter of each of the plurality of small-diameter fillers 99 may be more than 0 μm and not more than 5 μm. The diameter of each of the plurality of small-diameter fillers 99 may be more than 0 μm and not more than 0.1 μm, not less than 0.1 μm and not more than 0.5 μm, not less than 0.5 μm and not more than 1 μm, not less than 1 μm and not more than 1.5 μm, not less than 1.5 μm and not more than 2 μm, not less than 2 μm and not more than 2.5 μm, not less than 2.5 μm and not more than 3 μm, not less than 3 μm and not more than 3.5 μm, not less than 3.5 μm and not more than 4 μm, not less than 4 μm and not more than 4.5 μm, or not less than 4.5 μm and not more than 5 μm.

The plurality of large-diameter fillers 98 seal the rewiring layer 33 and the post electrode 70 together with the matrix resin 96 in a region outside the plurality of wiring recesses 44 and in a region outside the plurality of electrode recesses 74, respectively.

On the other hand, the plurality of small-diameter fillers 99 enter the plurality of wiring recesses 44 and the plurality of electrode recesses 74. Particularly, the plurality of small-diameter fillers 99 the diameter of each of which is 1 μm or less among the plurality of small-diameter fillers 99 easily enter the plurality of wiring recesses 44 and the plurality of electrode recesses 74.

The plurality of small-diameter fillers 99 fill the plurality of wiring recesses 44 and the plurality of electrode recesses 74 together with the matrix resin 96, respectively. The plurality of small-diameter fillers 99 guide the matrix resin 96 into the plurality of wiring recesses 44 and into the plurality of electrode recesses 74. In this way, the adhesive force of the sealing resin layer 93 with respect to the plurality of rewiring layers 33 and the plurality of post electrodes 70 is raised.

Also, the plurality of small-diameter fillers 99 also enter the club-shaped recess 45 of the wiring recess 44 and the club-shaped recess 75 of the electrode recess 74. The plurality of small-diameter fillers 99 fill the club-shaped recess 45 and the club-shaped recess 75 together with the matrix resin 96. The thus formed structure makes it possible to raise the anchor effect of the sealing resin layer 93 with respect to the plurality of rewiring layers 33 and the plurality of post electrodes 70.

Although not shown, the plurality of small-diameter fillers 99 enter the anchor recess 61. The plurality of small-diameter fillers 99 fill the anchor recess 61 together with the matrix resin 96. Also, the plurality of large-diameter fillers 98 may enter the anchor recess 61. The plurality of large-diameter fillers 98 may fill the anchor recess 61 together with the matrix resin 96.

The sealing resin layer 93 may include air bubbles (not shown) each of which has a diameter of more than 0 μm and not more than 2 μm. The sealing resin layer 93 having these air bubbles is formed by a compression molding method.

The diameter of the air bubble may be more than 0 μm and not more than 0.25 μm, not less than 0.25 μm and not more than 0.5 μm, not less than 0.5 μm and not more than 0.75 μm, not less than 0.75 μm and not more than 1 μm, not less than 1.25 μm and not more than 1.5 μm, not less than 1.5 μm and not more than 1.75 μm, or not less than 1.75 μm and not more than 2 μm. Preferably, the diameter of the air bubbles is 1 μm or less.

The air bubble has the possibility of acting as a starting point of the peel-off of the sealing resin layer 93. Therefore, it is possible to prevent the peel-off of the sealing resin layer 93, in which the air bubbles act as a starting point, by limiting the diameter of the air bubble to 2 μm or less (preferably, 1 μm or less).

Furthermore, it is possible to increase the contact area of the sealing resin layer 93 with the rewiring layer 33 by limiting the diameter of the air bubble to 2 μm or less (preferably, 1 μm or less) after forming the wiring recess 44, and therefore it is possible to appropriately prevent the peel-off of the sealing resin layer 93 from the rewiring layer 33.

Also, it is possible to increase the contact area of the sealing resin layer 93 with the post electrode 70 by limiting the diameter of the air bubble to 2 μm or less (preferably, 1 μm or less) after forming the electrode recess 74, and therefore it is possible to appropriately prevent the peel-off of the sealing resin layer 93 from the post electrode 70.

Also, it is possible to increase the contact area of the sealing resin layer 93 with the underlayer 32 by limiting the diameter of the air bubble to 2 μm or less (preferably, 1 μm or less) after forming the anchor recess 61, and therefore it is possible to appropriately prevent the peel-off of the sealing resin layer 93 from the underlayer 32.

Also, it is possible to appropriately prevent the peel-off of the sealing resin layer 93 from the anchor recess 61, from the rewiring layer 33, and from the post electrode 70 by applying the sealing resin layer 93 including the large-diameter filler 98 and the small-diameter filler 99 in the aforementioned structures.

Referring to FIG. 1 and FIG. 5, the device body 2 includes a main surface protective layer 100. The main surface protective layer 100 is formed on the second main surface 14 of the semiconductor layer 12. The main surface protective layer 100 may cover the entire surface of the second main surface 14 of the semiconductor layer 12, and may expose a part of the second main surface 14 (for example, a peripheral edge portion of the second main surface 14). The main surface protective layer 100 forms the second device main surface 4 and a part of the device lateral surfaces 5A to 5D.

The main surface protective layer 100 may have a single layer structure consisting of an organic insulating material layer. The main surface protective layer 100 may include a thermosetting resin that is an example of the organic insulating material layer. The main surface protective layer 100 may include an epoxy resin.

The thickness of the main surface protective layer 100 may be not less than 5 μm and not more than 100 μm. The thickness of the main surface protective layer 100 may be not less than 5 μm and not more than 25 μm, not less than 25 μm and not more than 50 μm, not less than 50 μm and not more than 75 μm, or not less than 75 μm and not more than 100 μm.

The device body 2 includes a plurality of conductive bonding materials 101. The plurality of conductive bonding materials 101 are each formed on the second electrode surface 72 of the post electrode 70 exposed from the resin main surface 94. The plurality of conductive bonding materials 101 are each formed on the second electrode surface 72 corresponding thereto in a one-to-one correspondence. Therefore, the plurality of conductive bonding materials 101 are formed with intervals therebetween along the first direction X and along the second direction Y. The plurality of conductive bonding materials 101 are arranged in a matrix in a plan view.

The plurality of conductive bonding materials 101 are each formed in the shape of a hemisphere that protrudes from the second electrode surface 72. The plurality of conductive bonding materials 101 each include solder or metallic paste. Preferably, the solder is lead-free.

The solder may include Sn (tin). The solder may include at least one among an Sn—Ag alloy, an Sn—Sb alloy, an Sn—Ag—Cu alloy, an Sn—Zn—Bi alloy, an Sn—Cu alloy, an Sn—Cu—Ni alloy, and an Sn—Sb—Ni alloy. The metallic paste may include at least one among aluminum, copper, silver, and gold.

In this embodiment, the semiconductor layer 12 includes a circumferential edge recess 102 formed at a circumferential edge of the first main surface 13. The circumferential edge recess 102 is hollowed from the first main surface 13 toward the second main surface 14. More specifically, the circumferential edge recess 102 passes through the underlayer 32, the protective insulation layer 23, and the main surface insulation layer 21, and is formed at the first main surface 13.

The circumferential edge recess 102 extends in a belt shape along the circumferential edge of the first main surface 13 in a plan view. More specifically, the circumferential edge recess 102 is formed in a ring shape (in this embodiment, in a quadrangular ring shape) that extends along the circumferential edge of the first main surface 13 in a plan view.

The circumferential edge recess 102 has a first wall surface 103 positioned on the first-main surface-13 side and a second wall surface 104 positioned on the second-main surface-14 side. The first wall surface 103 is inclined with respect to the first main surface 13. The second wall surface 104 is inclined with respect to the first wall surface 103. The second wall surface 104 is inclined at an angle differing from that of the first wall surface 103.

The recess angle of the second wall surface 104 with the first wall surfaces 103 in the circumferential edge recess 102 may be more than 90° and not more than 150°. The recess angle may be more than 90° and not more than 100°, not less than 1000 and not more than 110°, not less than 110° and not more than 120°, not less than 120° and not more than 130°, not less than 130° and not more than 140°, or not less than 140° and not more than 150°.

The sealing resin layer 93 enters the circumferential edge recess 102. The resin lateral surfaces 95A to 95D are defined by a part that enters the circumferential edge recess 102 in the sealing resin layer 93. Although not shown, the plurality of small-diameter fillers 99 may enter the circumferential edge recess 102. The plurality of small-diameter fillers 99 may fill the anchor recess 61 together with the matrix resin 96. Also, the plurality of large-diameter fillers 98 may enter the anchor recess 61. The plurality of large-diameter fillers 98 may fill the anchor recess 61 together with the matrix resin 96.

FIG. 10A to FIG. 10R are each a cross-sectional view to describe an example of a method of manufacturing the semiconductor device 1 shown in FIG. 1. In the manufacturing method of FIG. 10A to FIG. 10R, a plurality of semiconductor devices 1 are simultaneously manufactured, and yet, for convenience, a region in which two semiconductor devices 1 are manufactured is shown.

First, referring to FIG. 10A, a wafer-shaped semiconductor layer 12 is prepared. The semiconductor layer 12 may have a thickness of not less than 200 μm and not more than 1000 μm. Thereafter, the functional device 16 is formed at the semiconductor layer 12. Thereafter, the main surface insulation layer 21 is formed on the first main surface 13. Thereafter, the wiring electrode 22 is formed on the main surface insulation layer 21.

Thereafter, the protective insulation layer 23 is formed on the main surface insulation layer 21. The protective insulation layer 23 covers the wiring electrode 22 on the main surface insulation layer 21. Thereafter, the first pad opening 25 that exposes a partial region of the wiring electrode 22 as the electrode pad 24 is formed in the protective insulation layer 23. The first pad opening 25 is formed by removing an unnecessary portion of the protective insulation layer 23. The unnecessary portion of the protective insulation layer 23 may be removed by an etching method through a mask (not shown).

Thereafter, the underlayer 32 is formed on the protective insulation layer 23. In this embodiment, the underlayer 32 is made of a photosensitive resin. The underlayer 32 may be formed by a spin coating method, a spray coating method, or the like. Thereafter, the second pad opening 35 that exposes the electrode pad 24 is formed in the underlayer 32. The second pad opening 35 is formed by exposing the underlayer 32 with a predetermined pattern and then developing it.

Figure 10B:
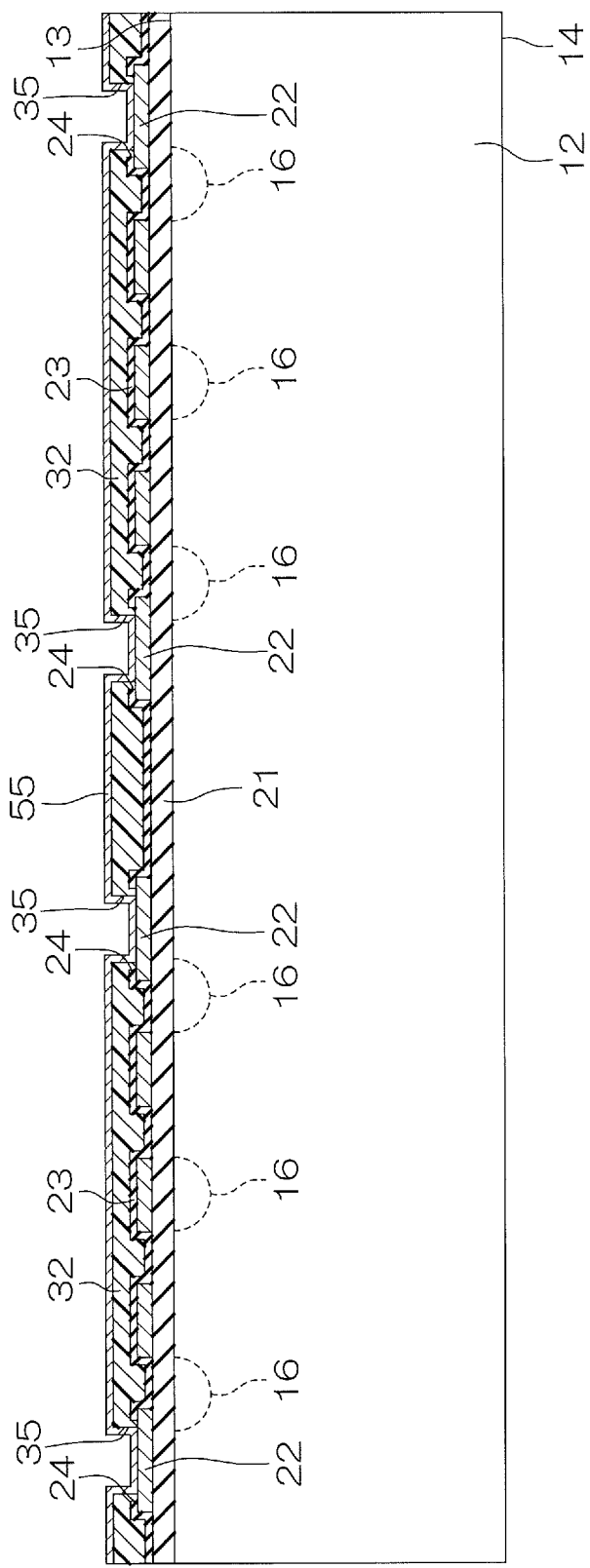
FIG. 10B is a cross-sectional view showing a step subsequent to that of FIG. 10A.

Thereafter, referring to FIG. 10B, the under wiring layer 55 is formed on the underlayer 32. The formation step of the under wiring layer 55 includes a step in which the first wiring layer 57 that is composed chiefly of Ti (titanium) and the second wiring layer 58 that is composed chiefly of Cu (copper) are formed in this order from the top of the underlayer 32. The first wiring layer 57 and the second wiring layer 58 may be each formed by a sputtering method.

Thereafter, referring to FIG. 10C, a mask 111 having a predetermined pattern is formed on the under wiring layer 55. The under wiring layer 55 has a plurality of openings 112 that expose a region in which the body wiring layer 56 is to be formed.

Figure 10D:
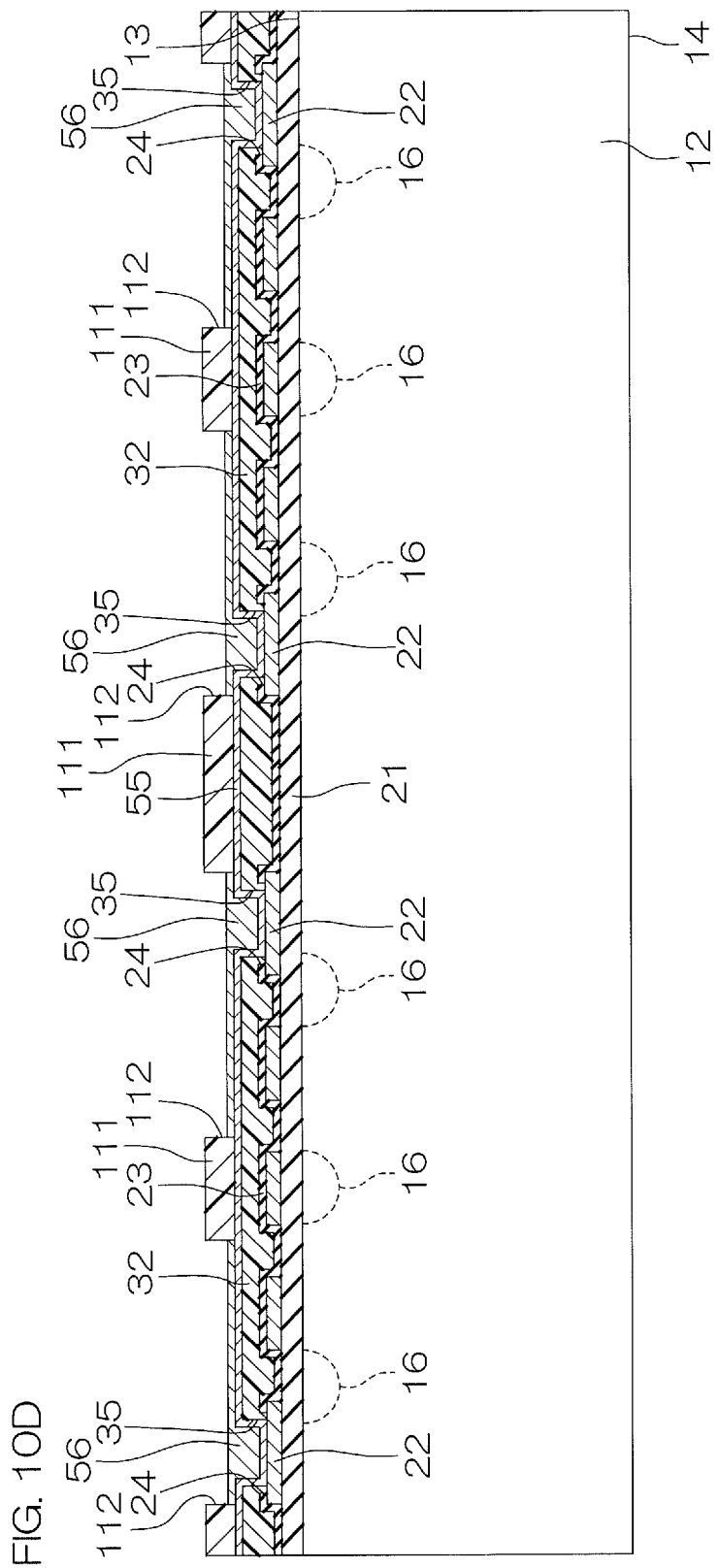
FIG. 10D is a cross-sectional view showing a step subsequent to that of FIG. 10C.

Thereafter, referring to FIG. 10D, the body wiring layer 56 that is composed chiefly of Cu (copper) is formed on the under wiring layer 55. The body wiring layer 56 is formed on a part exposed from the plurality of openings 112 in the under wiring layer 55. The body wiring layer 56 may be formed by a copper plating method.

Thereafter, referring to FIG. 10E, the mask 111 is removed.

Figure 10F:
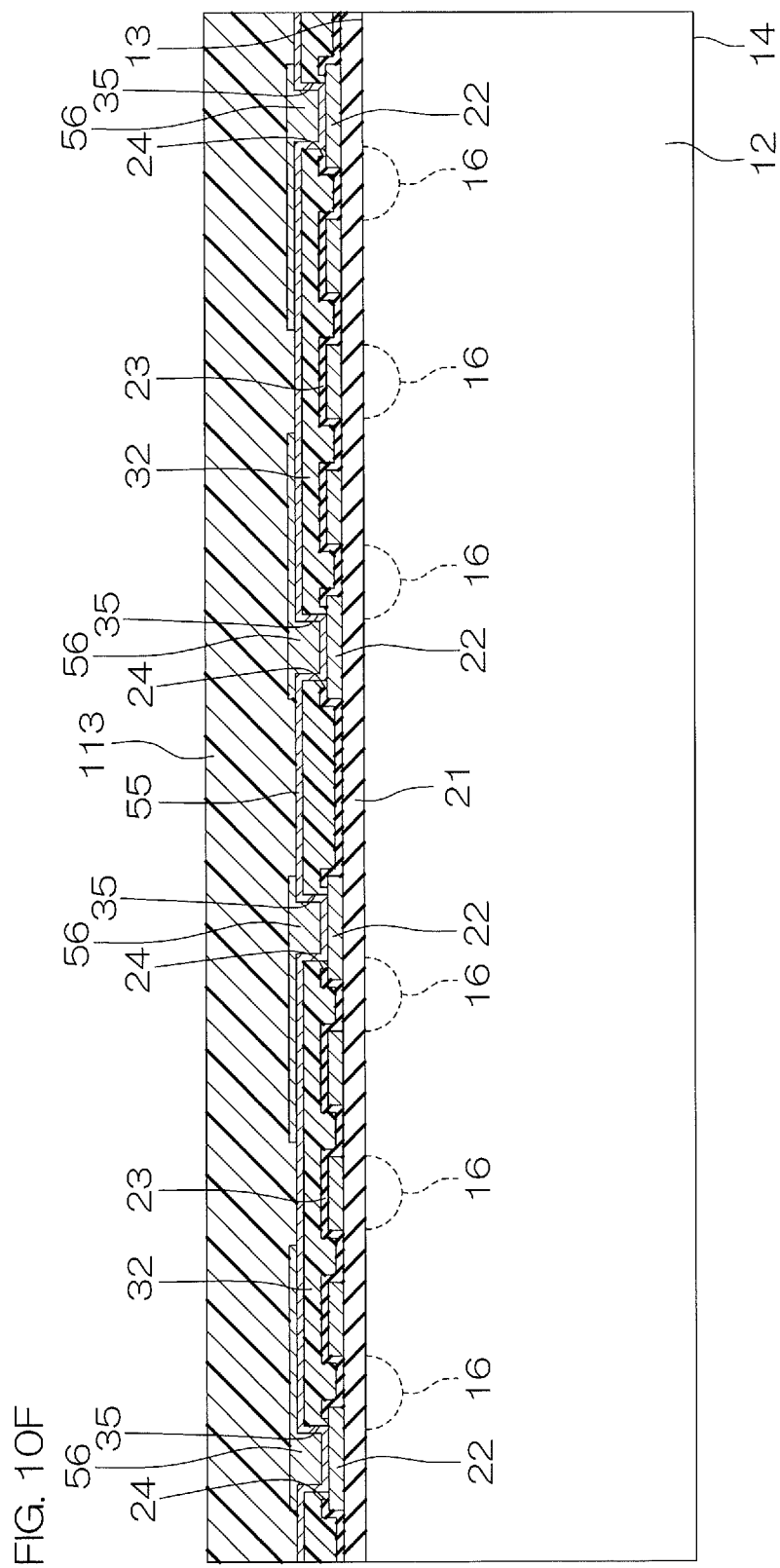
FIG. 10F is a cross-sectional view showing a step subsequent to that of FIG. 10E.

Thereafter, referring to FIG. 10F, a mask 113 is formed on the under wiring layer 55 such as to cover the body wiring layer 56. The mask 113 may be formed by applying a photosensitive resin. The mask 113 may be formed by pasting a masking material, such as a photosensitive-resin-made dry film.

Figure 10G:
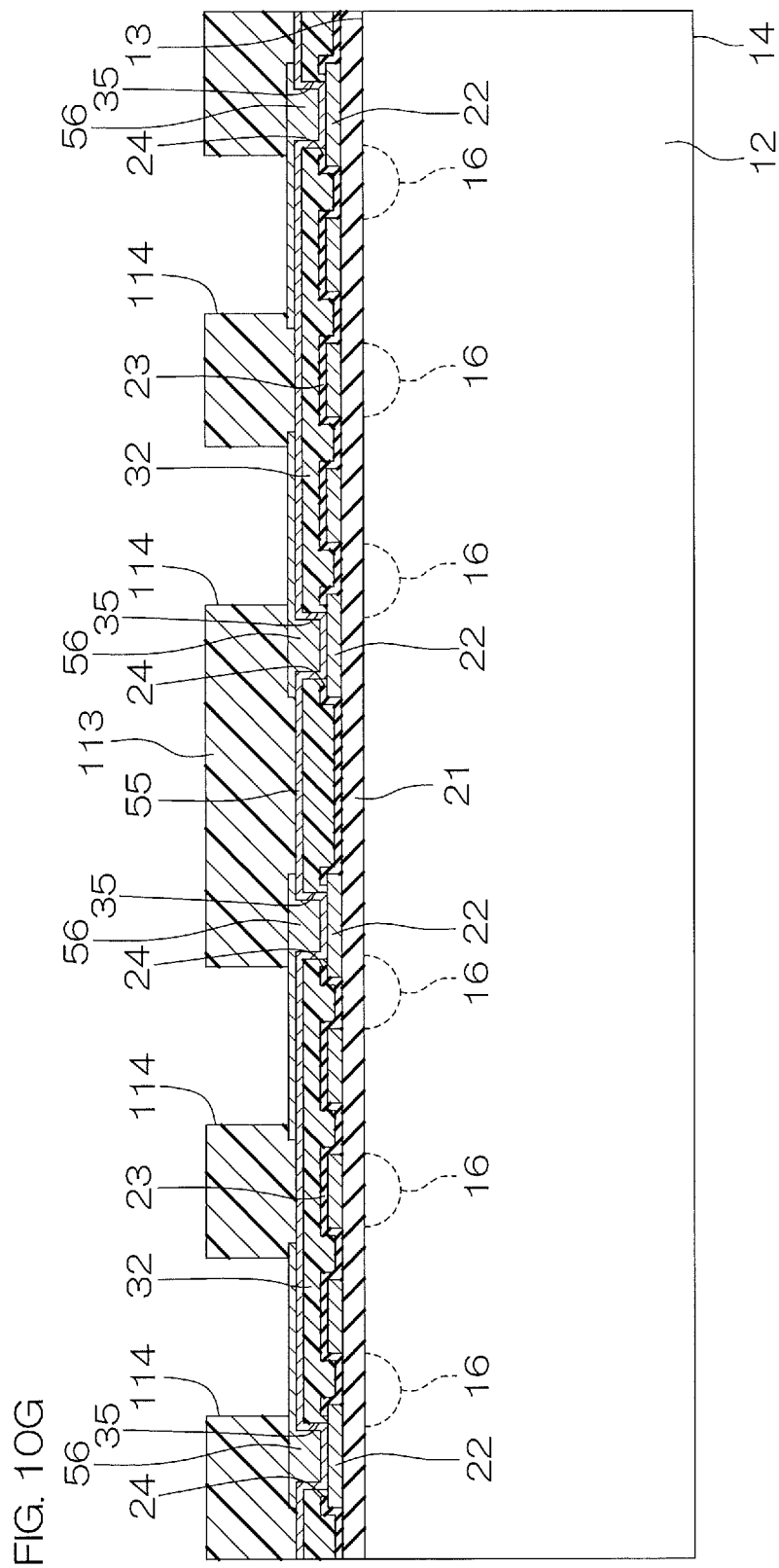
FIG. 10G is a cross-sectional view showing a step subsequent to that of FIG. 10F.

Thereafter, referring to FIG. 10G, a plurality of openings 114 each of which exposes a region in which the post electrode 70 is to be formed are formed in the mask 113. The plurality of openings 114 are formed by exposing the mask 113 with a predetermined pattern and then developing it.

Figure 10H:
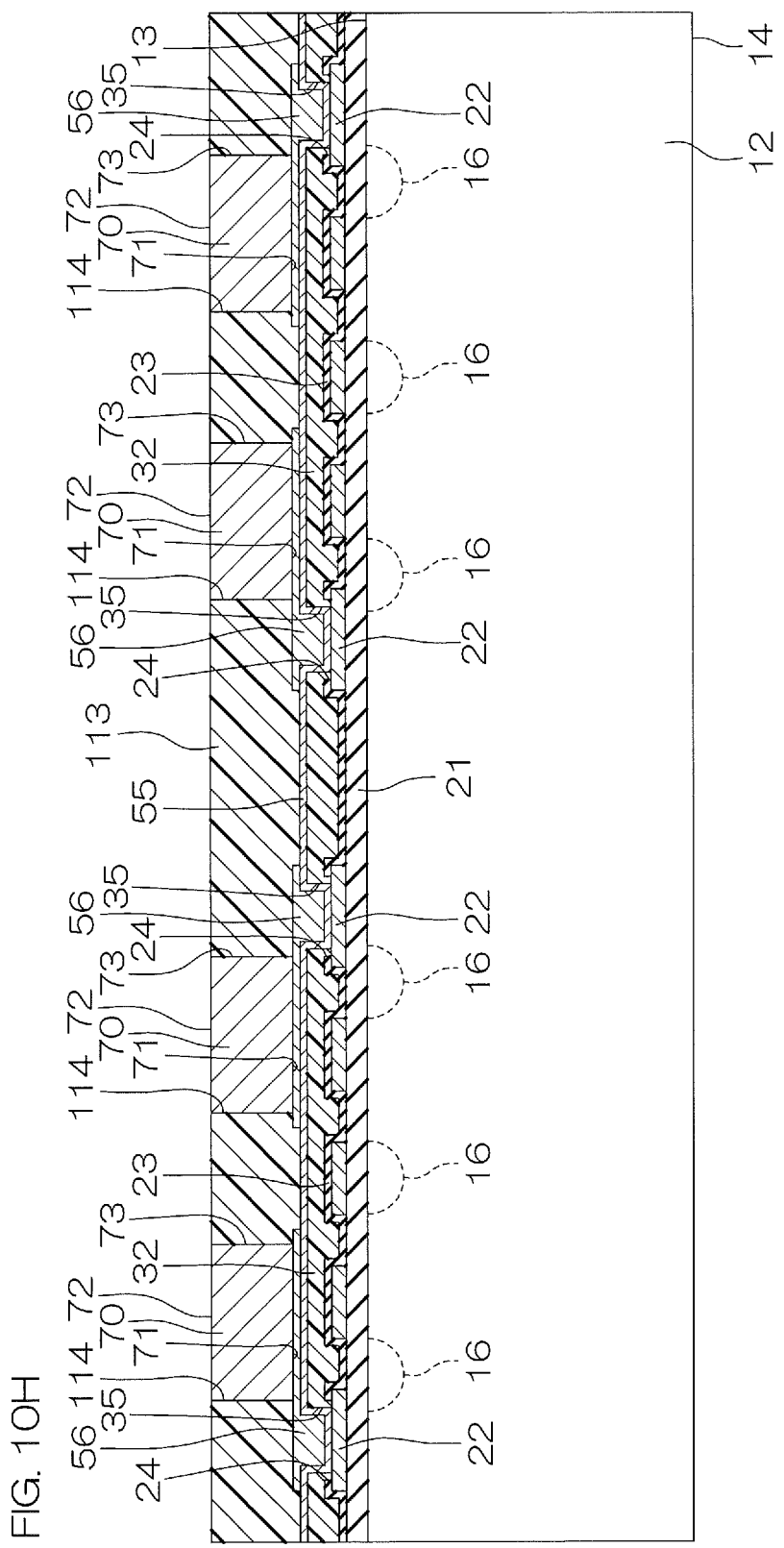
FIG. 10H is a cross-sectional view showing a step subsequent to that of FIG. 10G.

Thereafter, referring to FIG. 10H, the post electrode 70 that is composed chiefly of Cu (copper) is formed on the body wiring layer 56. The post electrode 70 is formed on a part exposed from the plurality of openings 114 in the body wiring layer 56. The post electrode 70 may be formed by the copper plating method.

Thereafter, referring to FIG. 10I, the mask 113 is removed.

Figure 10J:
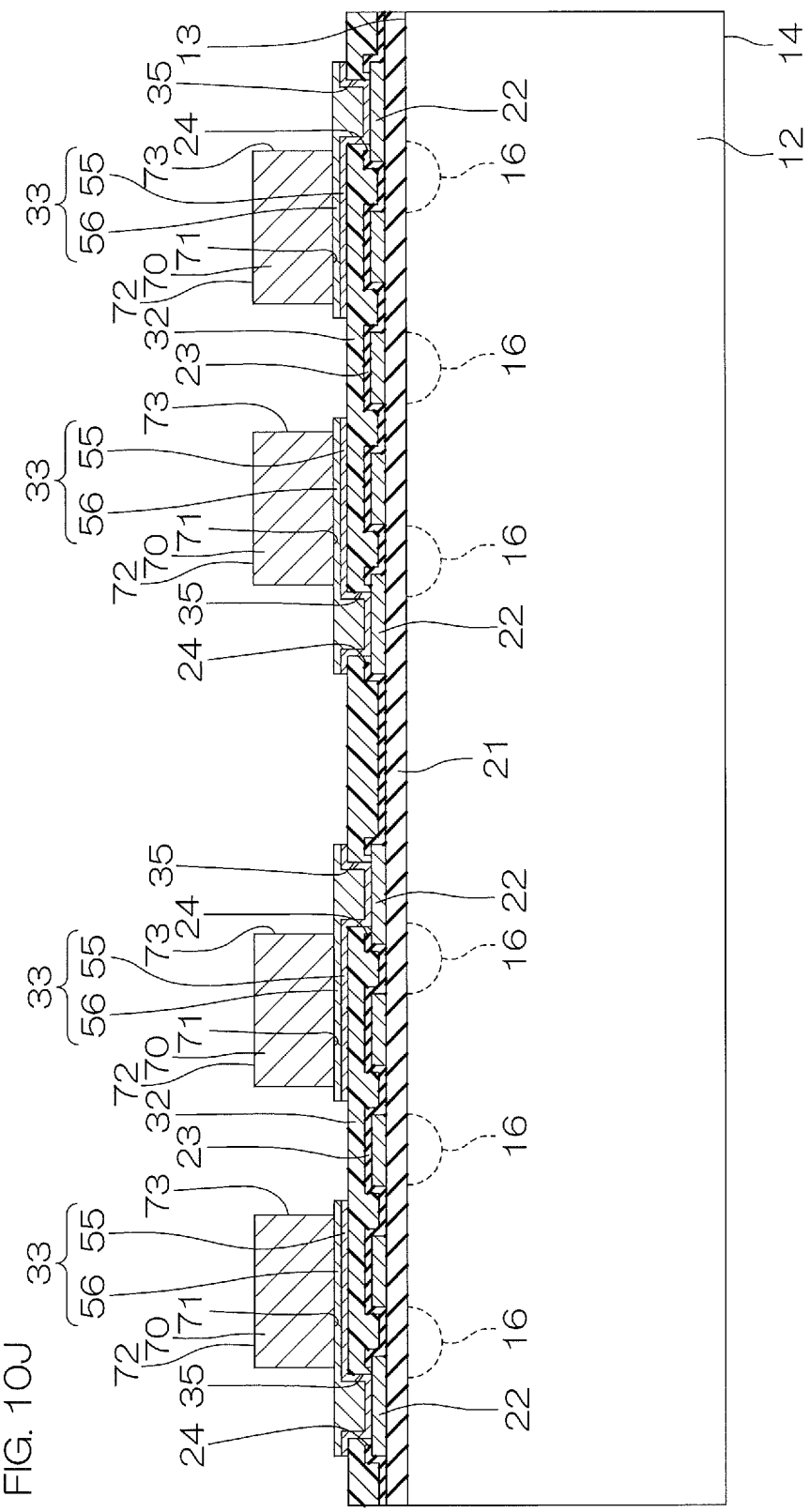
FIG. 10J is a cross-sectional view showing a step subsequent to that of FIG. 10I.

Thereafter, referring to FIG. 10J, an unnecessary portion of the under wiring layer 55 is removed. The unnecessary portion of the under wiring layer 55 is removed by the etching method through a mask (not shown). The etching method may be a wet etching method.

In this step, the second wiring layer 58 exposed from the body wiring layer 56 is first removed. Thereafter, the first wiring layer 57 exposed from the second wiring layer 58 is removed. Hence, the rewiring layer 33 including both the under wiring layer 55 and the body wiring layer 56 is formed.

Figure 10K:
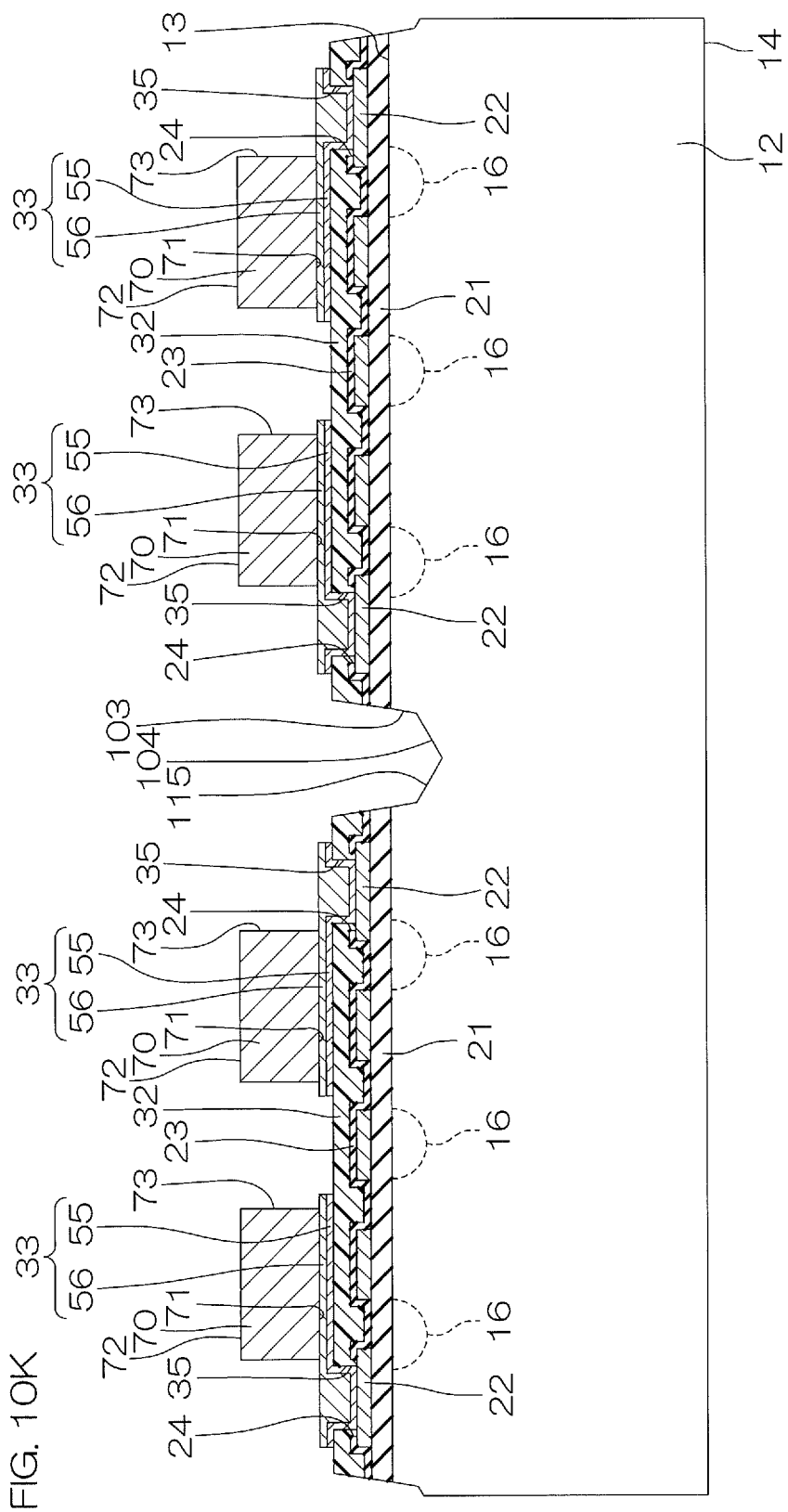
FIG. 10K is a cross-sectional view showing a step subsequent to that of FIG. 10J.
Figure 100:
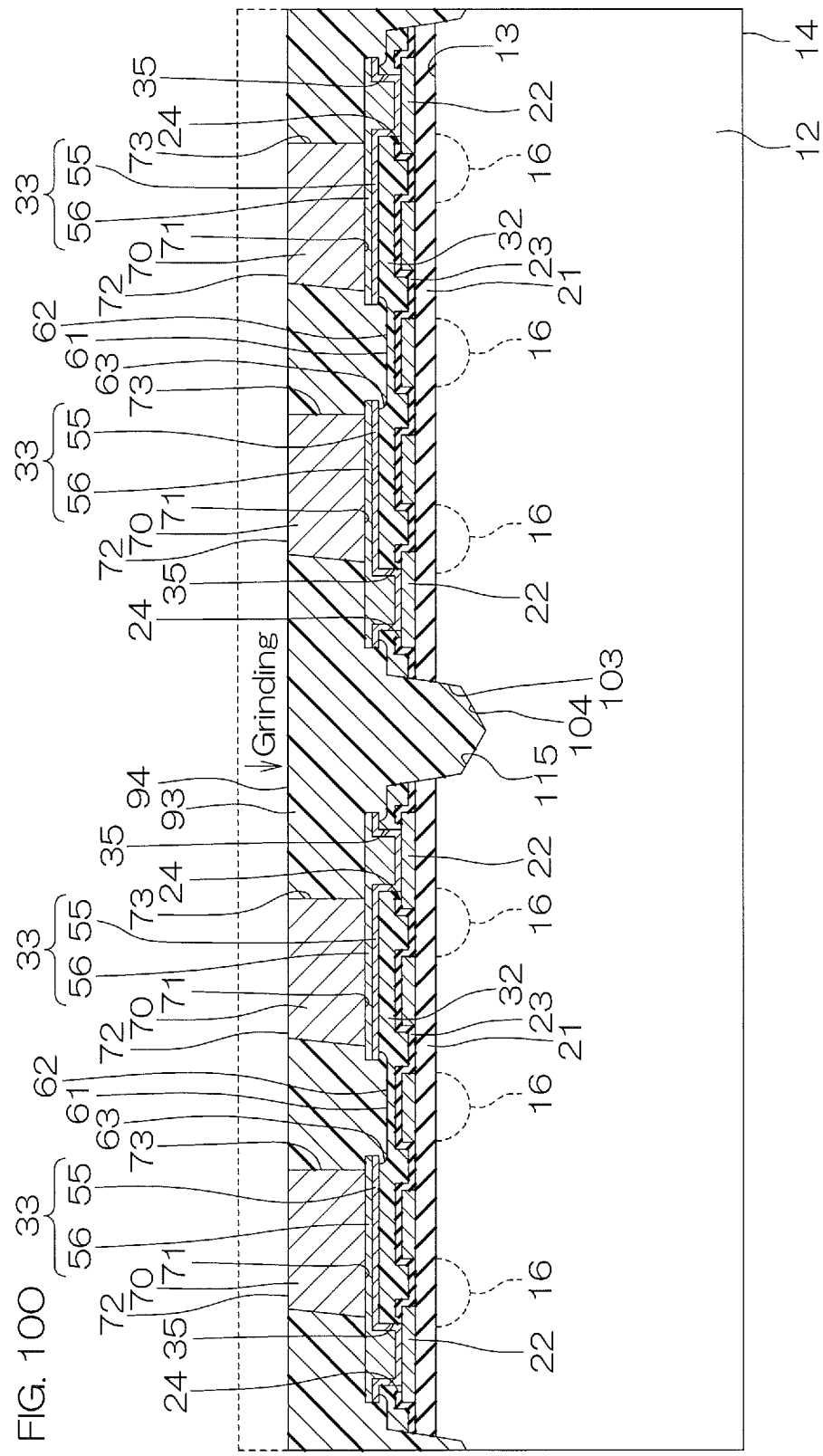

Thereafter, referring to FIG. 10K, a groove 115 is formed at the first main surface 13. The groove 115 passes through the underlayer 32, the protective insulation layer 23, and the main surface insulation layer 21, and is formed at the first main surface 13. The groove 115 serves as a base of the circumferential edge recess 102. The groove 115 may be formed by a grinding method that uses a grinding member, such as a dicing blade. An inner wall of the groove 115 is shaped in accordance with the shape of an edge of the grinding member.

In this step, the groove 115, which has the first wall surface 103 positioned on the first-main surface-13 side and the second wall surface 104 positioned on the second-main surface-14 side, is formed. The first wall surface 103 is inclined with respect to the first main surface 13. The second wall surface 104 is inclined at an angle differing from that of the first wall surface 103. The recess angle of the second wall surface 104 with the first wall surfaces 103 in the groove 115 may be more than 90° and not more than 150°.

Thereafter, referring to FIG. 10L, the anchor recess 61 is formed at a part exposed from the rewiring in the underlayer 32. The anchor recess 61 may be formed by an ashing method with respect to the underlayer 32. In the ashing method, an unnecessary portion of the underlayer 32 is isotropically removed. Hence, the anchor recess 61 having the exposed portion 62 and the concealed portion 63 is formed.

Thereafter, referring to FIG. 10M, an outer surface of the rewiring layer 33 is roughened, and an outer surface of the post electrode 70 is roughened. A roughening step of the rewiring layer 33 and a roughening step of the post electrode 70 are simultaneously performed. In this roughening step, the outer surface of the rewiring layer 33 and the outer surface of the post electrode 70 are roughened, respectively, by the wet etching method using a roughening etching liquid that reacts to copper. The roughening etching liquid may be an aqueous solution that includes sulfuric acid and hydrogen peroxide.

The roughening etching liquid may be supplied onto the first main surface 13 of the semiconductor layer 12 in a state in which the semiconductor layer 12 is being rotated around a rotational axis along the normal direction Z. In this case, the roughening etching liquid receives a centrifugal force resulting from the rotation of the semiconductor layer 12, and is discharged outwardly from the semiconductor layer 12. Hence, the plurality of wiring recesses 44 are formed at the outer surface of the rewiring layer 33, and the plurality of electrode recesses 74 are formed at the outer surface of the post electrode 70.

The roughening etching liquid forms a drainage flow path (see arrows in FIG. 10M) from a central portion of the semiconductor layer 12 to a peripheral edge portion of the semiconductor layer 12 in a state in which the semiconductor layer 12 is being rotated. A region positioned on the upstream side of the drainage flow path in the electrode lateral surface 73 of the post electrode 70 partially stops the roughening etching liquid.

Hence, the region positioned on the upstream side of the drainage flow path in the electrode lateral surface 73 of the post electrode 70 may be over-etched. In this case, the post electrode 70 that is tapered in a cross-sectional view may be formed. More specifically, the post electrode 70 may be formed such as to be asymmetric with respect to the normal line of the first electrode surface 71 (more specifically, may be formed in a non-line-symmetric shape) in a cross-sectional view.

A rinsing step may be performed after the roughening step. A rinsing liquid may be supplied onto the first main surface 13 of the semiconductor layer 12 in a state in which the semiconductor layer 12 is being rotated around the rotational axis along the normal direction Z. The roughening etching liquid that remains on the first main surface 13 is washed away by the rinsing liquid. The rinsing liquid may include at least one among pure water (deionized water), carbonated water, electrolyzed ion water, hydrogen water, ozone water, and aqueous hydrochloric acid solution of dilute concentration.

Thereafter, referring to FIG. 10N, the sealing resin layer 93 is formed on the first main surface 13 of the semiconductor layer 12. The sealing resin layer 93 collectively covers the rewiring layer 33 and the post electrode 70. In this embodiment, the sealing resin layer 93 includes the matrix resin 96 (epoxy resin) and the plurality of fillers 97 that are respectively non-uniform in diameter and that have been added to the matrix resin 96 (that have filled the matrix resin 96). The plurality of fillers 97 include the plurality of large-diameter fillers 98 and the plurality of small-diameter fillers 99.

The sealing resin layer 93 is formed by being pressed by a compression molding method in a reduced-pressure atmosphere. The atmospheric pressure when the sealing resin layer 93 is formed is set such that the diameter of an air bubble in the sealing resin layer 93 becomes equal to or less than 2 μm (preferably, 1 μm or less). Hence, the sealing resin layer 93 is formed with which the wiring recess 44, the electrode recess 74, the anchor recess 61, and the groove 115 are filled and with which the rewiring layer 33 and the post electrode 70 are collectively covered.

A step of forming an oxidation inhibiting film with which the rewiring layer 33 and the post electrode 70 are collectively covered may be performed prior to the formation step of the sealing resin layer 93. The oxidation inhibiting film protects both the rewiring layer 33 and the post electrode 70 from oxidation. The oxidation inhibiting film may be an organic thin film including an organic insulating material. The organic thin film may have a thickness of not less than 0.1 nm and not more than 10 nm. The organic thin film may include an epoxy resin.

In this case, the sealing resin layer 93 is formed integrally with the oxidation inhibiting film in the formation step of the sealing resin layer 93. In other words, the oxidation inhibiting film is incorporated as a part of the sealing resin layer 93. Of course, the sealing resin layer 93 may be formed in a mode in which an interface with the oxidation inhibiting film remains.

Thereafter, referring to FIG. 10O, the resin main surface 94 of the sealing resin layer 93 is ground until the post electrode 70 is exposed. The sealing resin layer 93 may be ground by a CMP (Chemical Mechanical Polishing) method. In this step, the second electrode surface 72 of the post electrode 70 is ground together with the resin main surface 94 of the sealing resin layer 93. Hence, the resin main surface 94 of the sealing resin layer 93 forms a single ground surface between the resin main surface 94 and the second electrode surface 72 of the post electrode 70.

Figure 10P:
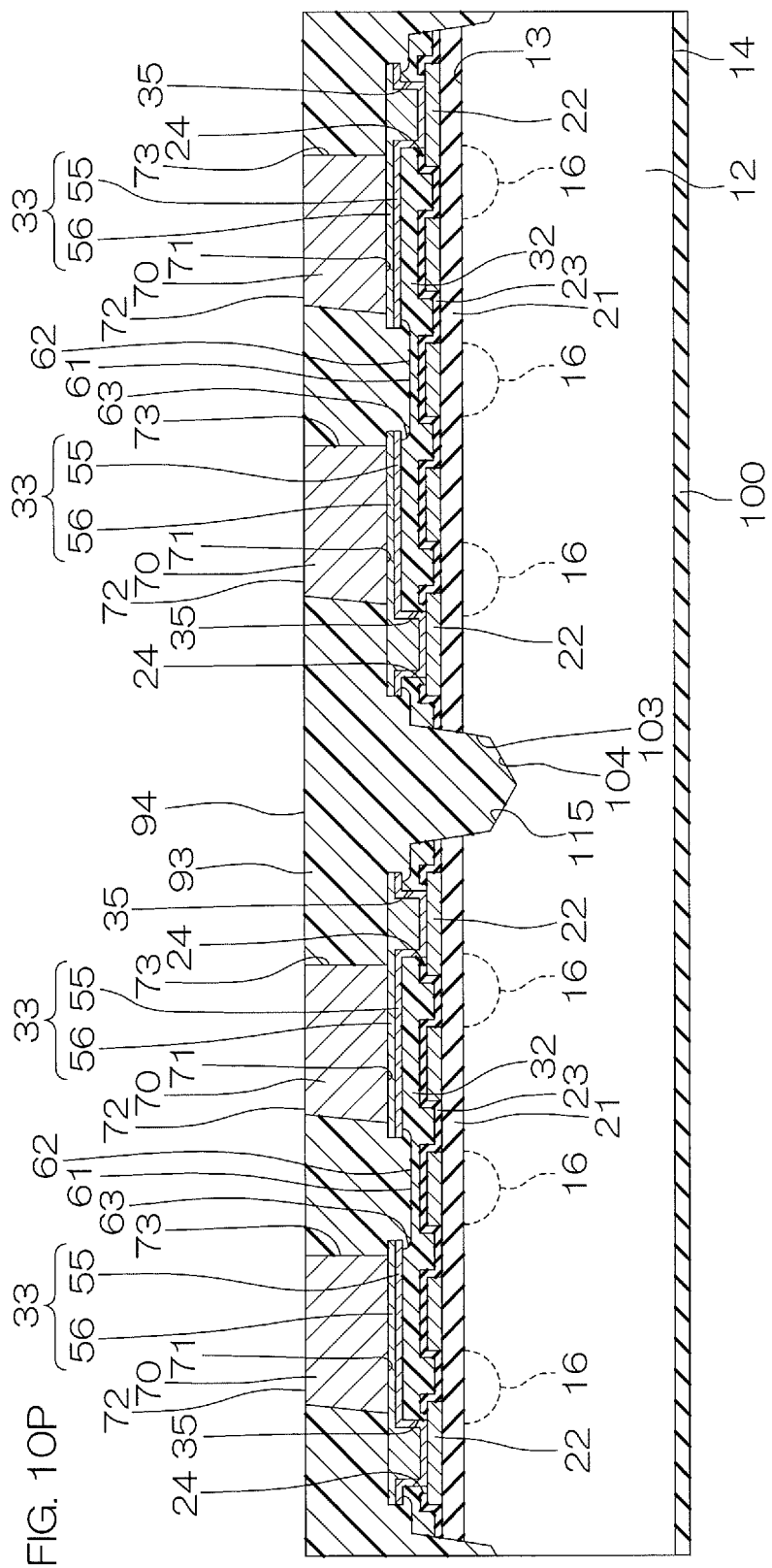
FIG. 10P is a cross-sectional view showing a step subsequent to that of FIG. 10O.

Thereafter, referring to FIG. 10P, the semiconductor layer 12 is thinned to reach a desired thickness by being ground from the second-main surface-14 side. The semiconductor layer 12 may be ground by the CMP method. Thereafter, the main surface protective layer 100 is formed on the second main surface 14 of the semiconductor layer 12. The main surface protective layer 100 includes an epoxy resin. The main surface protective layer 100 may be formed by the spin coating method, the spray coating method, etc.

Figure 10Q:
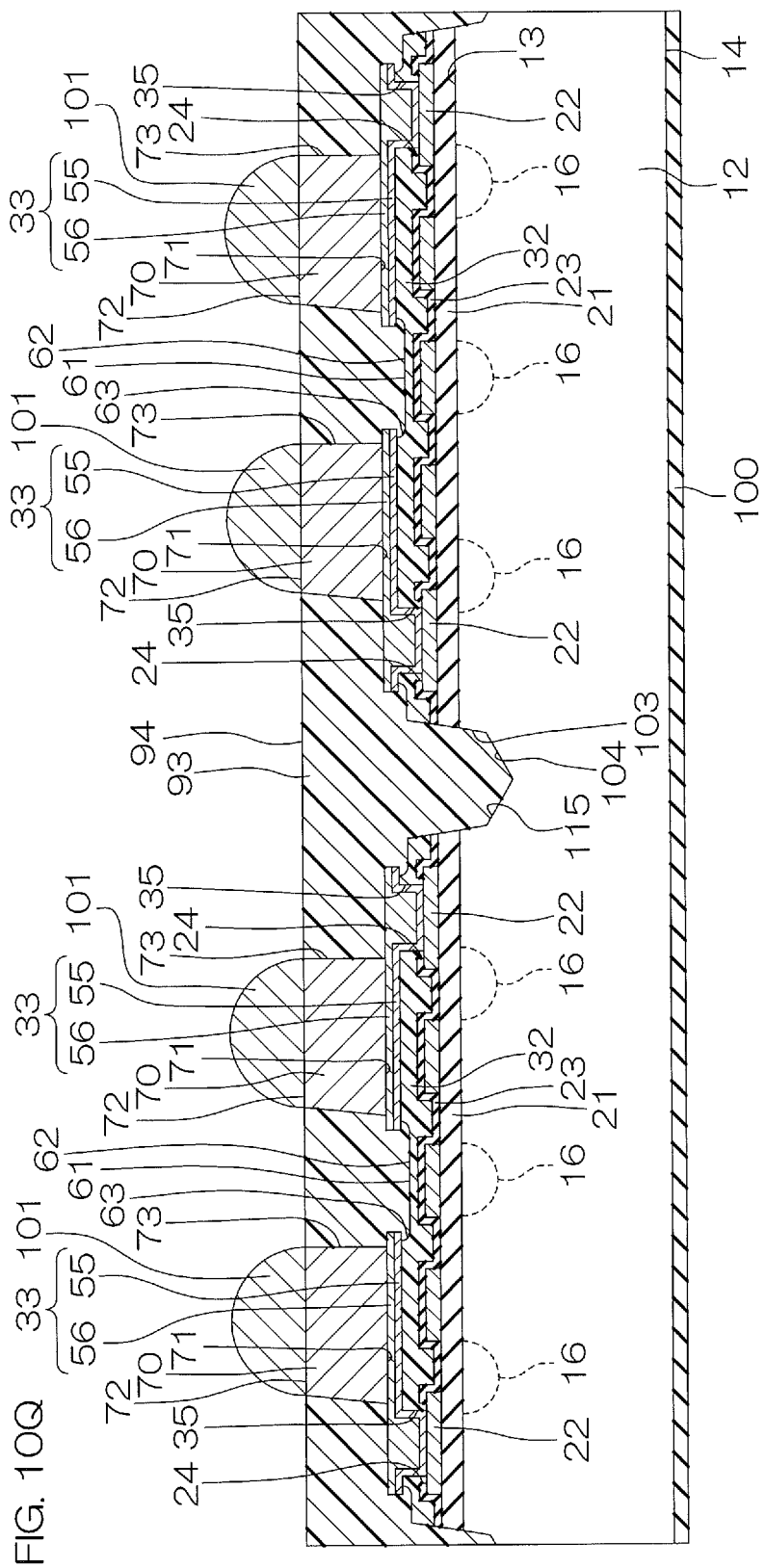
FIG. 10Q is a cross-sectional view showing a step subsequent to that of FIG. 10P.

Thereafter, referring to FIG. 10Q, the conductive bonding material 101 is formed on the second electrode surface 72 of the post electrode 70. The conductive bonding material 101 may include solder. If the conductive bonding material 101 includes solder, a reflow process may be applied at a temperature at which the solder melts.

Thereafter, referring to FIG. 10R, the wafer-shaped semiconductor layer 12 is cut along the groove 115. Hence, a plurality of semiconductor devices 1 are cut out from the single wafer-shaped semiconductor layer 12. The semiconductor layer 12 is cut by a grinding member, such as a dicing blade. In this step, a dicing blade that has an edge whose width is less than the width of the groove 115 may be used. A part, with which the groove 115 is covered, of the sealing resin layer 93 serves as a part of the device lateral surfaces 5A to 5D of the device body 2. The semiconductor device 1 is manufactured through the steps including the above.

The order of steps of FIG. 10A to FIG. 10R is an example, and is not limited to this order of steps. For example, the roughening step (see FIG. 10M) may be performed prior to the groove formation step (see FIG. 10K). Also, the roughening step with respect to the rewiring layer 33 and the roughening step with respect to the post electrode 70 (see FIG. 10M) may be performed at different timings.

For example, the roughening step with respect to the rewiring layer 33 (see FIG. 10M) may be performed prior to the formation step of the post electrode 70 (see FIG. 10I) after the formation step of the body wiring layer 56 (see FIG. 10E). In this case, the whole area of the second wiring surface 42 of the rewiring layer 33 is roughened.

Also, the roughening step with respect to the post electrode 70 (see FIG. 10M) may be performed at an arbitrary timing after the formation step of the post electrode 70 (see FIG. 10I). In this case, the post electrode 70 is formed on the second wiring surface 42 roughened in the rewiring layer 33.

In consideration of film-forming properties, preferably, the post electrode 70 is formed in a region (non-rough surface region 52) that is not roughened in the second wiring surface 42. Therefore, preferably, the roughening step with respect to the rewiring layer 33 and the roughening step with respect to the post electrode 70 are simultaneously performed.

As described above, according to the semiconductor device 1, it is possible to raise the adhesive force of the sealing resin layer 93 with respect to the rewiring layer 33 by the roughened second wiring surface 42. Also, according to the semiconductor device 1, it is possible to raise the adhesive force of the sealing resin layer 93 with respect to the post electrode 70 by the roughened electrode lateral surface 73. Therefore, it is possible to prevent the peel-off of the sealing resin layer 93.

Also, according to the semiconductor device 1, the post electrode 70 is formed on the non-rough surface region 52 in the second wiring surface 42 of the rewiring layer 33. This makes it possible to raise the adhesive force of the sealing resin layer 93 while raising the film-forming properties of the post electrode 70 with respect to the rewiring layer 33.

Also, according to the semiconductor device 1, the sealing resin layer 93 includes the matrix resin 96 and the plurality of fillers 97 that are respectively non-uniform in diameter. The plurality of large-diameter fillers 98 among the plurality of fillers 97 seal the rewiring layer 33 and the post electrode 70 together with the matrix resin 96 in a region outside the plurality of wiring recesses 44 and in a region outside the plurality of electrode recesses 74.

Also, the plurality of small-diameter fillers 99 among the plurality of fillers 97 fill the plurality of wiring recesses 44 and the plurality of electrode recesses 74 together with the matrix resin 96. This makes it possible to appropriately raise the adhesive force of the sealing resin layer 93 with respect to the rewiring layer 33 and the post electrode 70, thus making it possible to appropriately prevent the peel-off of the sealing resin layer 93.

Particularly, if the plurality of wiring recesses 44 include the club-shaped recess 45 and if the plurality of electrode recesses 74 include the club-shaped recess 75, it is possible to raise the anchor effect of the sealing resin layer 93 with respect to the plurality of wiring recesses 44 and the plurality of electrode recesses 74.

If the plurality of fillers 97 include the small-diameter filler 99, it is possible to appropriately guide the matrix resin 96 into the club-shaped recess 45 and into the club-shaped recess 75 by the small-diameter filler 99. This makes it possible to appropriately raise the anchor effect of the sealing resin layer 93 with respect to the plurality of wiring recesses 44 and the plurality of electrode recesses 74.

Also, according to the semiconductor device 1, the sealing resin layer 93 enters the anchor recess 61 formed at the underlayer 32. This makes it possible to raise the adhesive force of the sealing resin layer 93 with respect to the underlayer 32, thus making it possible to prevent the peel-off of the sealing resin layer 93.

In this case, preferably, the bottom wall of the anchor recess 61 is formed in an uneven shape by rising and/or sinking. This makes it possible to increase the contact area of the sealing resin layer 93 with respect to the bottom wall of the anchor recess 61, thus making it possible to appropriately raise the adhesive force of the sealing resin layer 93 with respect to the underlayer 32.

Also, according to the semiconductor device 1, the bottom wall of the anchor recess 61 includes the exposed portion 62 that is exposed from the rewiring layer 33 in a plan view and the concealed portion 63 that lies on the rewiring layer 33 in a plan view. The sealing resin layer 93 enters the anchor recess 61 from above the rewiring layer 33, and sandwiches the first wiring surface 41 and the second wiring surface 42 of the rewiring layer 33. This makes it possible to raise the anchor effect of the sealing resin layer 93 with respect to the anchor recess 61. Therefore, it is possible to appropriately prevent the peel-off of the sealing resin layer 93.

Also, according to the semiconductor device 1, the sealing resin layer 93 includes air bubbles (not shown) each of which has a diameter of more than 0 μm and not more than 2 μm. The air bubbles in the sealing resin layer 93 have the possibility of acting as a starting point of the peel-off of the sealing resin layer 93. Therefore, it is possible to appropriately increase the contact area of the sealing resin layer 93 with the underlayer 32, with the rewiring layer 33, and with the post electrode 70 by limiting the diameter of the air bubble to 2 μm or less (preferably, 1 μm or less). This makes it possible to appropriately prevent the peel-off of the sealing resin layer 93 from the underlayer 32, from the rewiring layer 33, and from the post electrode 70 in which the air bubble acts as a starting point.

Figure 11:
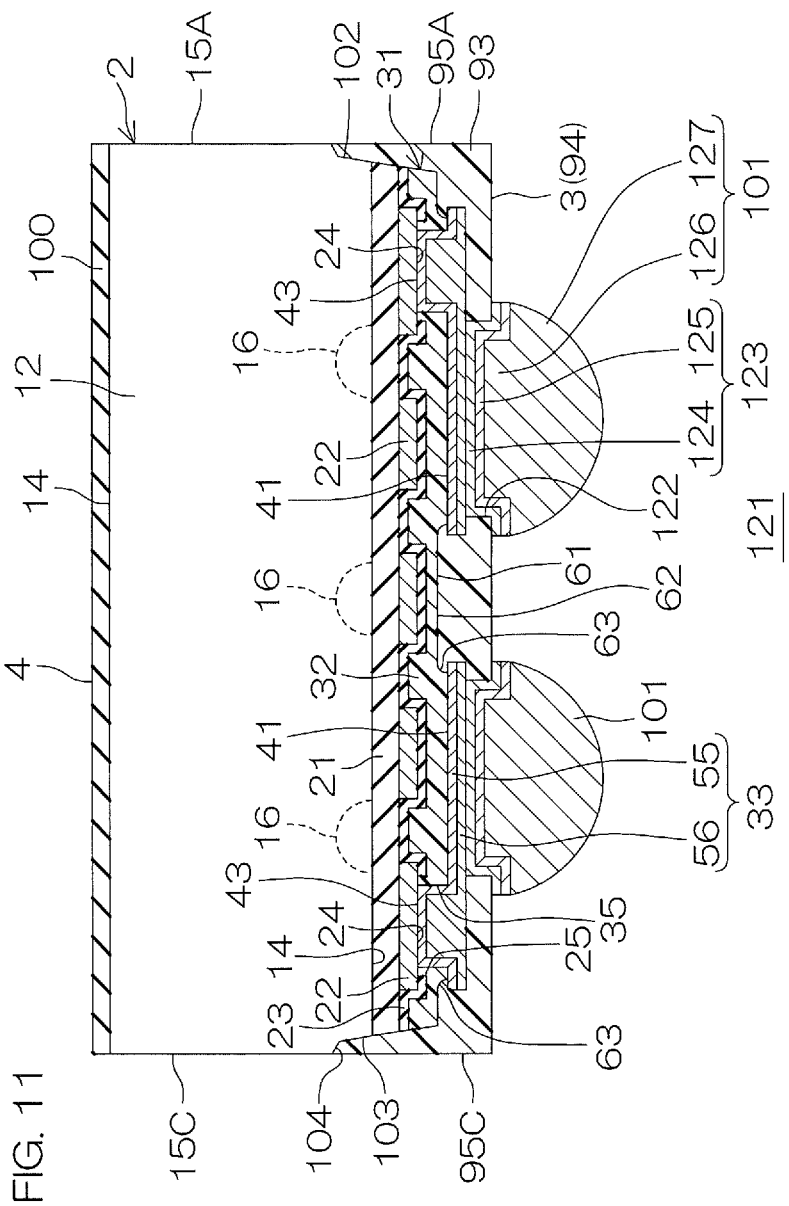
FIG. 11 is a schematic cross-sectional view, which corresponds to FIG. 5, of a semiconductor device according to a second preferred embodiment of the present invention.

FIG. 11 is a cross-sectional view corresponding to FIG. 5, and is a schematic cross-sectional view of a semiconductor device 121 according to a second preferred embodiment of the present invention. FIG. 11 schematically shows a configuration necessary for description, and does not show the cross section of a specific place of the semiconductor device 121. Hereinafter, the same reference sign is given to a constituent equivalent to each constituent of the semiconductor device 1 mentioned above, and a description of the constituent equivalent thereto is omitted.

The semiconductor device 1 has the post electrode 70. On the other hand, the conductive bonding material 101 is electrically connected to the rewiring layer 33 without the post electrode 70 in the semiconductor device 121. A structure of the semiconductor device 121 will be hereinafter described in detail.

Referring to FIG. 11, the sealing resin layer 93 has a plurality of openings 122 in this embodiment. The plurality of openings 122 expose the electrode connection portion 37 of the rewiring layer 33 corresponding thereto, respectively. In this embodiment, the whole area of the second wiring surface 42 of the rewiring layer 33 is roughened by the plurality of wiring recesses 44. Therefore, a part exposed from the opening 122 in the electrode connection portion 37 is the rough surface region 51. Of course, the part exposed from the opening 122 in the electrode connection portion 37 may be the non-rough surface region 52.

In this embodiment, the device body 2 includes a plurality of under electrode layers 123. The under electrode layer 123 is referred to also as an UBM layer. Each of the under electrode layers 123 is formed in the opening 122 corresponding thereto. Each of the under electrode layers 123 is electrically connected to the rewiring layer 33 in the corresponding opening 122. Each of the under electrode layers 123 extends in a film shape along the inner wall of the corresponding opening 122, and is drawn out onto the resin main surface 94. Each of the under electrode layers 123 defines a concave space in the corresponding opening 122.

In this embodiment, each of the under electrode layers 123 has a laminated structure in which a plurality of electrode layers are laminated. In this embodiment, the plurality of electrode layers include a first electrode layer 124 and a second electrode layer 125 that are laminated in this order from the rewiring-layer-33 side. The first electrode layer 124 may include a Ti layer that is composed chiefly of Ti (titanium). The second electrode layer 125 may include a Cu layer that is composed chiefly of Cu (copper).

The plurality of conductive bonding materials 101 are connected to the plurality of under electrode layers 123, respectively, in a one-to-one correspondence. In this embodiment, the plurality of conductive bonding materials 101 each function as an external terminal to be connected to the connected object, such as a mount board. Each of the conductive bonding materials 101 includes a buried portion 126 and a projection portion 127. The buried portion 126 of each of the conductive bonding materials 101 is positioned in a concave space defined by the under electrode layer 123 in the corresponding opening 122. The projection portion 127 of each of the conductive bonding materials 101 covers the under electrode layer 123 on the resin main surface 94, and protrudes hemispherically.

As described above, according to the semiconductor device 121, it is possible to fulfill an effect similar to the effect of the semiconductor device 1 mentioned above although it is impossible to obtain the effect according to the post electrode 70.

Figure 12:
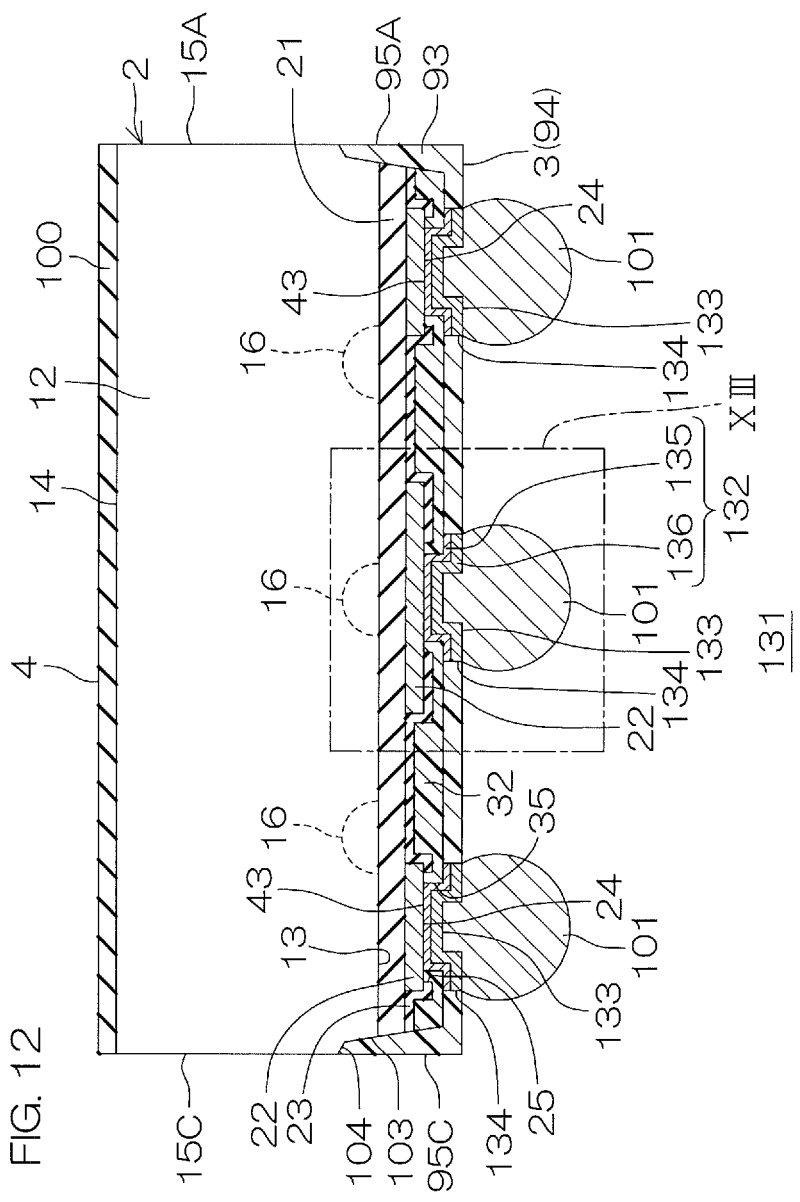
FIG. 12 is a schematic cross-sectional view, which corresponds to FIG. 5, of a semiconductor device according to a third preferred embodiment of the present invention.

FIG. 12 is a cross-sectional view corresponding to FIG. 5, and is a schematic cross-sectional view of a semiconductor device 131 according to a third preferred embodiment of the present invention. FIG. 13 is an enlarged view of region XIII of FIG. 12. FIG. 14 is an enlarged view of region XIV of FIG. 13. In the semiconductor device 131, the same reference sign is given to a constituent equivalent to each constituent of the semiconductor device 1 mentioned above, and a description of the constituent equivalent thereto is omitted.

Referring to FIG. 12, the semiconductor device 131 is an electronic component in which a WL-CSP (Wafer Level-Chip Size Package) is used as a package type in the same way as the semiconductor device 1. Unlike the semiconductor device 1, the semiconductor device 131 does not have the rewiring layer 33. The semiconductor device 131 includes a plurality of UBM (Under Bump (Barrier) Metal) electrodes 132 instead of the rewiring layer 33. The plurality of UBM electrodes 132 are connected to the corresponding electrode pads 24, respectively.

In detail, each of the UBM electrodes 132 is connected to the electrode pad 24 corresponding thereto in the second pad opening 35 corresponding thereto. Each of the UBM electrodes 132 is formed in a film shape along the electrode pad 24 and the wall surface of the second pad opening 35, and is drawn out from the top of the electrode pad 24 onto the underlayer 32.

Hence, each of the UBM electrodes 132 faces the first main surface 13 of the semiconductor layer 12, and has an electrode surface 133 that is hollowed toward the semiconductor-layer-12 side conforming to the second pad opening 35 and an electrode lateral surface 134 positioned on the underlayer 32. The electrode lateral surface 134 substantially perpendicularly extends with respect to the underlayer 32. The electrode surface 133 is not necessarily required to be hollowed toward the semiconductor-layer-12 side. The electrode surface 133 may have a flat surface that extends in parallel with the first main surface 13. The planar shape of each of the UBM electrodes 132 is arbitrary, and is not limited to a specific shape.

Each of the UBM electrodes 132 has a laminated structure in which a plurality of electrode layers are laminated. In this embodiment, each of the UBM electrodes 132 includes an under electrode layer 135 and a body electrode layer 136 that are laminated in this order from the wiring-electrode-22 side. The under electrode layer 135 includes a Ti layer that is composed chiefly of Ti (titanium). The Ti layer may be a Ti barrier layer. The body electrode layer 136 is made of a Cu layer that is composed chiefly of Cu (copper). The body electrode layer 136 may protrude more outwardly than the under electrode layer 135, and may define a space between the underlayer 32 and the body electrode layer 136.

The under electrode layer 135 may be formed by the sputtering method. The body electrode layer 136 may be formed by the sputtering method and/or the copper plating method. Each of the UBM electrodes 132 does not have the under electrode layer 135, and may have a single-layer structure consisting of the body electrode layer 136.

Referring to FIG. 14, the electrode lateral surface 134 of each of the UBM electrodes 132 includes the plurality of electrode recesses 74 in the same way as the electrode lateral surface 73 of the first preferred embodiment, and is roughened by the plurality of electrode recesses 74. In detail, the plurality of electrode recesses 74 are formed at the body electrode layer 136 in the electrode lateral surface 134. The plurality of electrode recesses 74 may be formed at the lower surface of the body electrode layer 136 exposed from the under electrode layer 135. The electrode lateral surface 134 of each of the UBM electrodes 132 has a second arithmetic mean roughness Ra2 in the same way as the electrode lateral surface 73 of the first preferred embodiment.

The plurality of electrode recesses 74 are formed by performing a roughening step for the electrode lateral surface 134 of each of the plurality of UBM electrodes 132. In this step, the electrode lateral surface 134 of each of the plurality of UBM electrodes 132 is roughened by the wet etching method using a roughening etching liquid that reacts to copper. The roughening etching liquid may be an aqueous solution that includes sulfuric acid and hydrogen peroxide.

The plurality of electrode recesses 74 are each hollowed from the electrode lateral surface 134 toward the inner side of the UBM electrode 132 in an irregular shape. Hence, an irregular uneven structure is formed on the electrode lateral surface 134. The plurality of electrode recesses 74 may include a single or a plurality of club-shaped recesses 75 in the same way as the electrode recess 74 of the first preferred embodiment. Also, the plurality of electrode recesses 74 may include a single or a plurality of tapered recesses 78 in the same way as the electrode recess 74 of the first preferred embodiment.

In this embodiment, the sealing resin layer 93 mentioned above covers the underlayer 32 and the electrode lateral surface 134 of each of the plurality of UBM electrodes 132 on the first main surface 13 of the semiconductor layer 12, and exposes the electrode surface 133 of each of the plurality of UBM electrodes 132. Preferably, the sealing resin layer 93 covers the whole area of the electrode lateral surface 134 of each of the plurality of UBM electrodes 132.

The resin main surface 94 of the sealing resin layer 93 may be formed such as to be flush with the electrode surface 133 of the UBM electrode 132. The resin main surface 94 of the sealing resin layer 93 may protrude toward the side opposite to the semiconductor layer 12 with respect to the electrode surface 133 of the UBM electrode 132. Of course, the resin main surface 94 of the sealing resin layer 93 may be positioned on the semiconductor-layer-12 side with respect to the electrode surface 133 of the UBM electrode 132. In other words, the sealing resin layer 93 may expose a part of the electrode lateral surface 134 of each of the plurality of UBM electrodes 132.

Referring to FIG. 14, the sealing resin layer 93 includes the matrix resin 96 and the plurality of fillers 97 that have been added to the matrix resin 96 (that have filled the matrix resin 96). The plurality of large-diameter fillers 98 among the plurality of fillers 97 seal the electrode lateral surface 134 of each of the plurality of UBM electrodes 132 and the underlayer 32 together with the matrix resin 96 in a region outside the plurality of electrode recesses 74, respectively. The large-diameter fillers 98 may fill a space defined between the body electrode layer 136 and the underlayer 32 together with the matrix resin 96.

On the other hand, the plurality of small-diameter fillers 99 (not shown in FIG. 14) of among the plurality of fillers 97 enter the plurality of electrode recesses 74. Particularly, the plurality of small-diameter fillers 99 the diameter of each of which is 1 μm or less among the plurality of small-diameter fillers 99 easily enter the plurality of electrode recesses 74. The plurality of small-diameter fillers 99 fill the plurality of electrode recesses 74, respectively, together with the matrix resin 96. The plurality of small-diameter fillers 99 guide the matrix resin 96 into the plurality of electrode recesses 74. In this way, the adhesive force of the sealing resin layer 93 with respect to the plurality of UBM electrodes 132 is raised. The plurality of small-diameter fillers 99 may fill a space defined between the body electrode layer 136 and the underlayer 32 together with the matrix resin 96.

The plurality of conductive bonding materials 101 mentioned above are each formed on the electrode surface 133 of the corresponding UBM electrode 132 in a one-to-one correspondence. The plurality of conductive bonding materials 101 are each connected to the corresponding electrode pad 24 through the corresponding UBM electrode 132. The plurality of conductive bonding materials 101 are each formed in the shape of a hemisphere that protrudes from the resin main surface 94 of the sealing resin layer 93.

As described above, according to the semiconductor device 131, it is possible to raise the adhesive force of the sealing resin layer 93 with respect to the UBM electrode 132 by the roughened electrode lateral surface 134 of the UBM electrode 132.

In this embodiment, an example where the electrode lateral surface 134 of each of the plurality of UBM electrodes 132 is roughened was described. However, the electrode surface 133 of each of the plurality of UBM electrodes 132 may include the plurality of electrode recesses 74, and may be roughened by the plurality of electrode recesses 74 in the same way as the electrode lateral surface 134. In this case, it is recommended to simultaneously roughen the electrode surface 133 and the electrode lateral surface 134 of each of the plurality of UBM electrodes 132. The electrode surface 133 of each of the plurality of UBM electrodes 132 may have a first arithmetic mean roughness Ra1 in the same way as the second wiring surface 42 of the first preferred embodiment.

The preferred embodiment of the present invention can be carried out in other embodiments.

In the first preferred embodiment, an example where the plurality of conductive bonding materials 101 are each formed on the second electrode surface 72 of the post electrode 70 was described. However, the plurality of conductive bonding materials 101 may be removed.

In the second preferred embodiment, an example where the under electrode layer 123 is formed was described. However, the under electrode layer 123 may be removed. In this case, the plurality of conductive bonding materials 101 may be each connected directly to the rewiring layer 33 in the corresponding opening 122.

In each of the preferred embodiments, an example where the circumferential edge recess 102 is formed at the first main surface 13 of the semiconductor layer 12 was described. However, the circumferential edge recess 102 may be removed. In this case, the device lateral surfaces 5A to 5D may be formed by the main surface insulation layer 21, by the protective insulation layer 23, and by the underlayer 32 in addition to the semiconductor layer 12 and the sealing resin layer 93. Such a configuration is produced by cutting the semiconductor layer 12 by a grinding member having an edge that exceeds the width of the groove 115 in an individual-piece cutting step (see FIG. 10R).

In each of the preferred embodiments, an example where the roughened electrode is covered with the resin was described. The configuration in which the roughened electrode is covered with the resin is applicable also to a semiconductor package. A TOP (Transistor Outline Package), an SOP (Small Outline Package), a QFN (Quad For Non Lead Package), a DFP (Dual Flat Package), a DIP (Dual Inline Package), a QFP (Quad Flat Package), an SIP (Single Inline Package), or an SOJ (Small Outline J-leaded Package) may be used as the semiconductor package, or various packages similar to these packages may be used as the semiconductor package.

The semiconductor package includes a lead frame, a semiconductor chip, a bonding material, a lead wire, and a molding resin. The lead frame includes a plurality of parts obtained by being molded into various forms in accordance with the kind of a package and then being electrically separated. A part of or the whole of the outer surface of the lead frame includes a plurality of recesses, and is roughened by the plurality of recesses.

The semiconductor chip is disposed on an arbitrary part of the lead frame. The bonding material is a metal bonding material or an insulation bonding material. The bonding material is interposed between the lead frame and the semiconductor chip, and connects the semiconductor chip to the lead frame. The lead wire is, for example, a bonding wire, and is connected to an arbitrary region of the semiconductor chip and to an arbitrary part of the lead frame.

The molding resin forms a package body of the semiconductor package. The molding resin seals the lead frame, the semiconductor chip, the lead wire, and the bonding material, and exposes a plurality of arbitrary parts of the lead frame as external terminals, respectively. The molding resin fills a plurality of recesses formed at the outer surface of the lead frame.

In detail, the molding resin includes a matrix resin and a plurality of fillers that have been added to the matrix resin (that have filled the matrix resin). The matrix resin includes an epoxy resin. The plurality of fillers include an insulating material (for example, silicon oxide), and are each formed in the shape of a particle or a ball that is non-uniform in diameter (in size). The plurality of large-diameter fillers among the plurality of fillers seal the lead frame, the semiconductor chip, the lead wire, and the bonding material in a region outside the plurality of recesses together with the matrix resin, respectively.

On the other hand, the plurality of small-diameter fillers among the plurality of fillers fill the plurality of recesses of the lead frame together with the matrix resin, respectively. The plurality of small-diameter fillers guide the matrix resin into the plurality of recesses of the lead frame. Particularly, the plurality of small-diameter fillers the diameter of each of which is 1 μm or less among the plurality of small-diameter fillers easily enter the plurality of recesses of the lead frame. In this way, the molding resin engages with the plurality of recesses of the lead frame, and the adhesive force of the molding resin with respect to the lead frame is raised.

In the manufacturing step of the semiconductor package, first, a step of preparing the lead frame is performed. Thereafter, a step of connecting a semiconductor chip onto an arbitrary part of the lead frame through a bonding material is performed. Thereafter, a step of connecting the lead wire to an arbitrary region of the semiconductor chip and to the arbitrary part of the lead frame is performed. Thereafter, a step of sealing the lead frame, the semiconductor chip, the lead wire, and the bonding material by a molding resin such as to expose the plurality of arbitrary parts of the lead frame as external terminals, respectively, is performed. Subsequent to this step, it is permitted to perform a step of cutting a sealing structure that includes the lead frame, the semiconductor chip, the lead wire, the bonding material, and the molding resin and then cutting out the semiconductor package in accordance with the kind of the package.

The lead-frame roughening step can be performed at an arbitrary timing prior to the sealing step using the molding resin. The lead-frame roughening step may be performed prior to the step of connecting the semiconductor chip to the lead frame. In this case, a part of the outer surface of the lead frame may be roughened, and the whole area of the outer surface of the lead frame may be roughened. A roughening etching liquid for the lead frame is selected in accordance with the material properties of the lead frame. The molding resin fills the plurality of recesses formed at the outer surface of the lead frame, and seals the lead frame, the semiconductor chip, the lead wire, and the bonding material. Hence, the adhesive force of the molding resin with respect to the lead frame is raised.

Examples of features, which are extracted from this description and from the drawings (particularly, FIG. 12 to FIG. 14), are shown as follows. [A1] to [A9] mentioned below aim to provide a semiconductor device capable of raising the adhesive force of a resin with respect to an UBM (Under Bump (Barrier) Metal) electrode.

[A1] A semiconductor device including a semiconductor layer that has a main surface, an electrode pad that is formed on the main surface, an underlayer that covers the main surface and that has a pad opening by which the electrode pad is exposed, an UBM electrode that is connected to the electrode pad in the pad opening, that is drawn out onto the underlayer, that is positioned on an electrode surface facing the main surface and on the underlayer, and that has a roughened electrode lateral surface, and a resin that covers the underlayer and the electrode lateral surface of the UBM electrode and that exposes the electrode surface of the UBM electrode.

According to this semiconductor device, it is possible to raise the adhesive force of the resin with respect to the UBM electrode by the roughened electrode lateral surface of the UBM electrode.

[A2] The semiconductor device according to A1, further including a conductive bonding material formed on the electrode surface.

[A3] The semiconductor device according to A1 or A2, where the UBM electrode includes copper.

[A4] The semiconductor device according to any one of A1 to A3, where the resin includes a matrix resin and a plurality of fillers that are added to the matrix resin and that are respectively non-uniform in diameter.

[A5] The semiconductor device according to A4, where the electrode lateral surface of the UBM electrode is roughened by a plurality of recesses, and the resin includes a plurality of large-diameter fillers that cover the underlayer and the electrode lateral surface in a region outside the plurality of recesses together with the matrix resin and a plurality of small-diameter fillers that fill the plurality of recesses together with the matrix resin.

[A6] The semiconductor device according to A4 or A5, where the matrix resin is made of an epoxy resin.

[A7] The semiconductor device according to any one of A1 to A6, where the UBM electrode is formed in a film shape along the electrode pad and an inner wall of the pad opening.

[A8] The semiconductor device according to any one of A1 to A7, where the underlayer is made of a photosensitive resin.

[A9] The semiconductor device according to any one of A1 to A8, the semiconductor device consisting of a chip size package.

This application corresponds to Japanese Patent Application No. 2018-214867 filed in the Japan Patent Office on Nov. 15, 2018, the entire disclosure of which is incorporated herein by reference. Although the preferred embodiments of the present invention have been described in detail, these preferred embodiments are merely concrete examples used to clarify the technical contents of the present invention, and the present invention should not be interpreted by being limited to these concrete examples, and the scope of the present invention is limited solely by the appended Claims.

REFERENCE SIGNS LIST

1 Semiconductor device
12 Semiconductor layer
13 First main surface
23 Protective insulation layer
24 Electrode pad
33 Rewiring layer
41 First wiring surface
42 Second wiring surface
44 Wiring recess
51 Non-rough surface region
52 Rough surface region
70 Post electrode
71 First electrode surface
72 Second electrode surface
73 Electrode lateral surface
74 Electrode recess
93 Sealing resin layer
94 Resin main surface
96 Matrix resin
97 Filler
98 Large-diameter filler
99 Small-diameter filler
100 Conductive bonding material
121 Semiconductor device

The invention claimed is:

1. A semiconductor device comprising:
a semiconductor layer that has a main surface;
an electrode pad that is formed on the main surface;
an underlayer that is formed on the main surface and that has an opening by which the electrode pad is exposed;
a rewiring that has a first wiring surface connected to the electrode pad and a second wiring surface positioned on a side opposite to the first wiring surface and being roughened, the rewiring being connected to the electrode pad in the opening and being drawn out from the opening onto the underlayer;
a post electrode connected to the second wiring surface;
a resin that covers the second wiring surface on the main surface and that seals both the rewiring and the post electrode such as to expose a part of the post electrode; and
an underlayer recess formed at a part exposed from the rewiring in the underlayer.

2. The semiconductor device according to claim 1, wherein the second wiring surface includes a first region that is roughened and a second region that is smaller in surface roughness than the first region, and
the post electrode is connected to the second region.

3. The semiconductor device according to claim 1, wherein the post electrode has a first electrode surface connected to the second wiring surface, a second electrode surface positioned on a side opposite to the first electrode surface, and an electrode lateral surface that connects the first electrode surface and the second electrode surface together and that is roughened, and
the resin seals the post electrode such as to expose the second electrode surface and such as to cover the electrode lateral surface.

4. The semiconductor device according to claim 1, wherein the post electrode has a thickness that exceeds a thickness of the rewiring.

5. The semiconductor device according to claim 1, wherein the post electrode is formed in a pillar shape that extends along a normal direction of the second wiring surface.

6. The semiconductor device according to claim 1, wherein the post electrode is formed in a tapered shape that becomes gradually narrower from the rewiring in a direction opposite to the semiconductor layer.

7. The semiconductor device according to claim 1, wherein the post electrode includes copper.

8. The semiconductor device according to claim 1, further comprising:
a conductive bonding material connected to the post electrode.

9. The semiconductor device according to claim 1, wherein the rewiring includes copper.

10. The semiconductor device according to claim 1, wherein the first wiring surface of the rewiring has a roughened portion.

11. The semiconductor device according to claim 10, wherein the roughened portion of the first wiring surface of the rewiring is formed at a position opposite the underlayer recess in a thickness direction of the rewiring.

12. The semiconductor device according to claim 3, wherein the second wiring surface has a first arithmetic mean roughness, and
the electrode lateral surface has a second arithmetic mean roughness less than the first arithmetic mean roughness.

13. The semiconductor device according to claim 12, wherein the first arithmetic mean roughness is not less than 0.5 µm and not more than 2.0 µm.

14. The semiconductor device according to claim 12, wherein the second arithmetic mean roughness is more than 0 µm and less than 0.5 µm.

15. The semiconductor device according to claim 3, wherein the second wiring surface has a first arithmetic mean roughness, and
the electrode lateral surface has a second arithmetic mean roughness less than the first arithmetic mean roughness.

16. The semiconductor device according to claim 12, wherein the first arithmetic mean roughness is not less than 0.5 µm and not more than 2.0 µm.

17. The semiconductor device according to claim 12, wherein the second arithmetic mean roughness is more than 0 µm and less than 0.5 µm.

18. A semiconductor device comprising: a semiconductor layer that has a main surface;
an electrode pad that is formed on the main surface;
a rewiring that has a first wiring surface connected to the electrode pad and a second wiring surface positioned on a side opposite to the first wiring surface and being roughened, the rewiring being formed on the main surface such as to be drawn out to a region outside the electrode pad; and
a resin that covers the second wiring surface on the main surface and that seals the rewiring;
wherein the resin includes a matrix resin and a plurality of fillers that are added to the matrix resin and that are respectively non-uniform in diameter.

19. The semiconductor device according to claim 18, wherein the second wiring surface of the rewiring is roughened by a plurality of wiring recesses, and
the resin includes a plurality of large-diameter fillers that cover the rewiring in a region outside the plurality of wiring recesses together with the matrix resin and a plurality of small-diameter fillers that fill the plurality of wiring recesses together with the matrix resin.

20. A semiconductor device comprising:
a semiconductor layer that has a main surface;
an electrode pad that is formed on the main surface;
a rewiring that is connected to the electrode pad and that is formed on the main surface such as to be drawn out to a region outside the electrode pad;
a post electrode having a first electrode surface connected to the rewiring, a second electrode surface positioned on a side opposite to the first electrode surface, and an electrode lateral surface that connects the first electrode surface and the second electrode surface together and that is roughened; and
a resin that exposes the second electrode surface on the main surface and that seals the rewiring and the post electrode such as to cover the electrode lateral surface.

21. The semiconductor device according to claim 20, wherein the resin has a resin main surface that is continuous with the second electrode surface.

22. The semiconductor device according to claim 20, wherein the resin includes a matrix resin and a plurality of fillers that are added to the matrix resin and that are respectively non-uniform in diameter.

23. The semiconductor device according to claim 22, wherein the electrode lateral surface of the post electrode is roughened by a plurality of electrode recesses, and
the resin includes a plurality of large-diameter fillers that cover the rewiring and the post electrode in a region outside the plurality of electrode recesses together with the matrix resin and a plurality of small-diameter fillers that fill the plurality of electrode recesses together with the matrix resin.

24. A semiconductor device comprising:
a semiconductor layer that has a main surface;
an electrode pad that is formed on the main surface;
an underlayer that is formed on the main surface and that has an opening by which the electrode pad is exposed;
a rewiring that has a first wiring surface connected to the electrode pad and a second wiring surface positioned on a side opposite to the first wiring surface and being roughened, the rewiring being connected to the electrode pad in the opening and being drawn out from the opening onto the underlayer;
a resin that covers the second wiring surface on the main surface and that seals the rewiring; and
an underlayer recess formed at a part exposed from the rewiring in the underlayer.

25. A semiconductor device comprising:
a semiconductor layer that has a main surface;
an electrode pad that is formed on the main surface;
a rewiring that has a first wiring surface connected to the electrode pad and a second wiring surface positioned on a side opposite to the first wiring surface and being roughened, the rewiring being formed on the main surface such as to be drawn out to a region outside the electrode pad;
a post electrode connected to the second wiring surface; and
a resin that covers the second wiring surface on the main surface and that seals both the rewiring and the post electrode such as to expose a part of the post electrode.

26. A semiconductor device comprising:
a semiconductor layer that has a main surface;
an electrode pad that is formed on the main surface;
a rewiring that has a first wiring surface connected to the electrode pad and a second wiring surface positioned on a side opposite to the first wiring surface and being roughened, the rewiring being formed on the main surface such as to be drawn out to a region outside the electrode pad;
a post electrode connected to the second wiring surface; and
a resin that covers the second wiring surface on the main surface and that seals both the rewiring and the post electrode such as to expose a part of the post electrode.

27. A semiconductor device comprising:
a semiconductor layer that has a main surface;
an electrode pad that is formed on the main surface;
a rewiring that has a first wiring surface connected to the electrode pad and a second wiring surface positioned on a side opposite to the first wiring surface and being roughened, the rewiring being formed on the main surface such as to be drawn out to a region outside the electrode pad;
a post electrode connected to the second wiring surface; and
a resin that covers the second wiring surface on the main surface and that seals both the rewiring and the post electrode such as to expose a part of the post electrode.

* * * * *